(12) United States Patent
Brisebois et al.

(10) Patent No.: US 8,416,710 B2
(45) Date of Patent: Apr. 9, 2013

(54) INDOOR COMPETITIVE SURVEY OF WIRELESS NETWORKS

(75) Inventors: Arthur Richard Brisebois, Cumming, GA (US); Robert Klein, Manchester, CT (US)

(73) Assignee: AT&T Mobility II LLC, Atlanta, GA (US)

( * ) Notice: Subject to any disclaimer, the term of this patent is extended or adjusted under 35 U.S.C. 154(b) by 606 days.

(21) Appl. No.: 12/413,970

(22) Filed: Mar. 30, 2009

(65) Prior Publication Data
US 2010/0246544 A1   Sep. 30, 2010

(51) Int. Cl.
*H04L 12/28* (2006.01)

(52) U.S. Cl. ........ 370/254; 370/255; 370/328; 370/331; 370/338

(58) Field of Classification Search .......... 370/254–255, 370/328, 331–334, 338, 252; 455/432.1–444
See application file for complete search history.

(56) References Cited

U.S. PATENT DOCUMENTS

| | | | |
|---|---|---|---|
| 7,269,727 B1 * | 9/2007 | Mukherjee et al. | 713/160 |
| 8,121,046 B2 * | 2/2012 | Morrison et al. | 370/252 |
| 8,130,737 B2 * | 3/2012 | Singh et al. | 370/338 |
| 2003/0095663 A1 * | 5/2003 | Nelson et al. | 380/270 |
| 2005/0117527 A1 * | 6/2005 | Williams et al. | 370/260 |
| 2006/0106850 A1 * | 5/2006 | Morgan et al. | 707/101 |
| 2006/0141998 A1 * | 6/2006 | Kennedy et al. | 455/423 |
| 2007/0025293 A1 * | 2/2007 | Choi | 370/331 |
| 2007/0081503 A1 * | 4/2007 | Mower | 370/338 |
| 2007/0091864 A1 * | 4/2007 | Honjo et al. | 370/338 |
| 2007/0117573 A1 * | 5/2007 | Kennedy et al. | 455/456.1 |
| 2007/0140163 A1 * | 6/2007 | Meier et al. | 370/329 |
| 2007/0248033 A1 * | 10/2007 | Bejerano et al. | 370/318 |
| 2007/0254632 A1 * | 11/2007 | Beadle et al. | 455/411 |
| 2009/0103503 A1 * | 4/2009 | Chhabra | 370/338 |
| 2009/0129341 A1 * | 5/2009 | Balasubramanian et al. | 370/331 |
| 2009/0232049 A1 * | 9/2009 | Singh et al. | 370/328 |
| 2010/0130189 A1 * | 5/2010 | Morrison et al. | 455/422.1 |
| 2010/0151858 A1 * | 6/2010 | Brisebois et al. | 455/434 |
| 2011/0086614 A1 * | 4/2011 | Brisebois et al. | 455/411 |
| 2011/0228665 A1 * | 9/2011 | Kumar et al. | 370/216 |
| 2012/0244794 A1 * | 9/2012 | Brisebois et al. | 455/1 |

* cited by examiner

*Primary Examiner* — Chuong T Ho

(74) *Attorney, Agent, or Firm* — Turocy & Watson, LLP

(57) ABSTRACT

System(s) and method(s) are provided to collect network operation data within a confined indoor wireless environment for generation of competitive intelligence and strategic network planning. Scanner component(s) survey and compare signals transported in a set of electromagnetic frequency bands, and in accordance with a set of radio technologies associated with competing networks. Collected data can be aggregated and delivered to femto gateway node(s), which can supply the data to an analysis component that generates network operations NetOp intelligence. A report component can manage received and aggregated network operation data and convey a portion thereof to planning tool(s) that can produce competitive intelligence and develop strategic network planning. Planning tool(s) can request specific network operation data or NetOp intelligence. Aggregated network operation data can be employed to identify service provider indoor coverage strengths or weaknesses relative to competitors to focus sales activities related to network services, and network improvement efforts.

44 Claims, 16 Drawing Sheets

ID
INDOOR COMPETITIVE SURVEY OF WIRELESS NETWORKS

TECHNICAL FIELD

The subject innovation relates to wireless communications and, more particularly, to collecting network operation data within a confined indoor wireless environment for generation of competitive intelligence and strategic network planning.

BACKGROUND

As wireless services and associated mobile devices continue to become a commodity, competitive pressure on wireless network service providers with respect to service quality or operating costs continues to grow. Indoor coverage is among the primary differentiator of wireless service quality. For wireless network based on outdoor deployment of base stations, building new cell sites is one approach to improve indoor coverage, and reduce customer attrition and associated subscriber re-acquisition costs. Yet, excessive cell site building can lead to higher cost of service provision, reduced margins and subscribed churn due, for example, to pricing pressures. An approach to balance cost(s) and benefit(s) of cell deployment growth consists of acquisition of information on a service provider network and those of competing providers to which a subscriber may migrate.

Conventional techniques for residential indoor service quality measurements are typically impractical since such techniques require expensive test equipment, labor and permission to enter the residence. The alternative, however, generally includes operation of expensive vehicles fitted with complex and expensive test equipment and operated by highly trained, costly radio-frequency (RF) engineers; the vehicle driven through sample neighborhoods acquiring measurements from vehicle-mounted antennas. Detail and accuracy of such indirect measurements often are sacrificed in exchange for cost and time containment. More importantly, even the best conventional measurements excluded indoor areas. Consequently, conventional approaches to probing indoor quality of service generally lead to aggressive data processing and application of ad-hoc "correction factors" to extrapolate indoor coverage statistics from outdoor measurements. While modeling and simulation of wireless signal propagation can be sophisticated on a per-residence level, different residence layout, building materials and other realistic indoor coverage factors, such as RF radiation scattering, render even the most complex model impractical for application over a significant, statistically significant sample of neighborhoods and residences. Accordingly, information extracted from conventional approaches to assessment of indoor wireless service quality generally results in unsatisfactory actionable information and ensuing faulty decision-making and strategic planning in connection with cell site growth, service quality and forecasted operational margins.

SUMMARY

The following presents a simplified summary of the innovation in order to provide a basic understanding of some aspects of the invention. This summary is not an extensive overview of the invention. It is intended to neither identify key or critical elements of the invention nor delineate the scope of the innovation. Its sole purpose is to present some concepts of the invention in a simplified form as a prelude to the more detailed description that is presented later.

The subject innovation provides system(s) and method(s) to collect network operation data within a confined indoor wireless environment for generation of competitive intelligence and strategic network planning. Scanner component(s) survey and compare signals transported in a set of electromagnetic frequency bands, and in accordance with a set of radio technologies associated with competing networks. Collected data can be aggregated and delivered to femto gateway node(s), which can supply the data to an analysis component that generates network operations NetOp intelligence. A report component can manage received and aggregated network operation data and convey a portion thereof to planning tool(s) that can produce competitive intelligence and develop strategic network planning. Planning tool(s) can request specific network operation data or NetOp intelligence. Aggregated network operation data can be used to identify service provider indoor coverage strengths or weaknesses relative to competitors to focus sales activities related to network services, and network improvement efforts.

Indoor competitive network survey as described in the subject innovation provides indoor service quality information that is critical to network operator that pursue service development, improved quality of extant deployed operations, and enhanced cost margins associated with service and development thereof; wherein, development, improvements, margins can be assessed against internal and competitive benchmarks.

Aspects, features, or advantages of the subject innovation can be exploited in substantially any wireless telecommunication, or radio, technology; for example, Wi-Fi, Worldwide Interoperability for Microwave Access (WiMAX); Enhanced General Packet Radio Service (Enhanced GPRS); Third Generation Partnership Project (3GPP) Long Term Evolution (LTE); Third Generation Partnership Project 2 (3GPP2) Ultra Mobile Broadband (UMB); 3GPP UMTS; High Speed Packet Access (HSPA); High Speed Downlink Packet Access (HSDPA); High Speed Uplink Packet Access (HSUPA), or LTE Advanced. Additionally, substantially all aspects of the subject innovation can include legacy telecommunication technologies.

It is noted that while various aspects, features, or advantages of the subject innovation are illustrated through femto access point(s) and associated femto network platform, such aspects and features also can be exploited in indoor-based base stations (e.g., home-based access point(s), enterprise-based access point(s)) that provide wireless coverage through substantially any, or any, disparate telecommunication technologies such as for example Wi-Fi (wireless fidelity) or picocell telecommunication.

To the accomplishment of the foregoing and related ends, the invention, then, comprises the features hereinafter fully described. The following description and the annexed drawings set forth in detail certain illustrative aspects of the invention. However, these aspects are indicative of but a few of the various ways in which the principles of the invention may be employed. Other aspects, advantages and novel features of the invention will become apparent from the following detailed description of the invention when considered in conjunction with the drawings.

DETAILED DESCRIPTION

Figure 1:
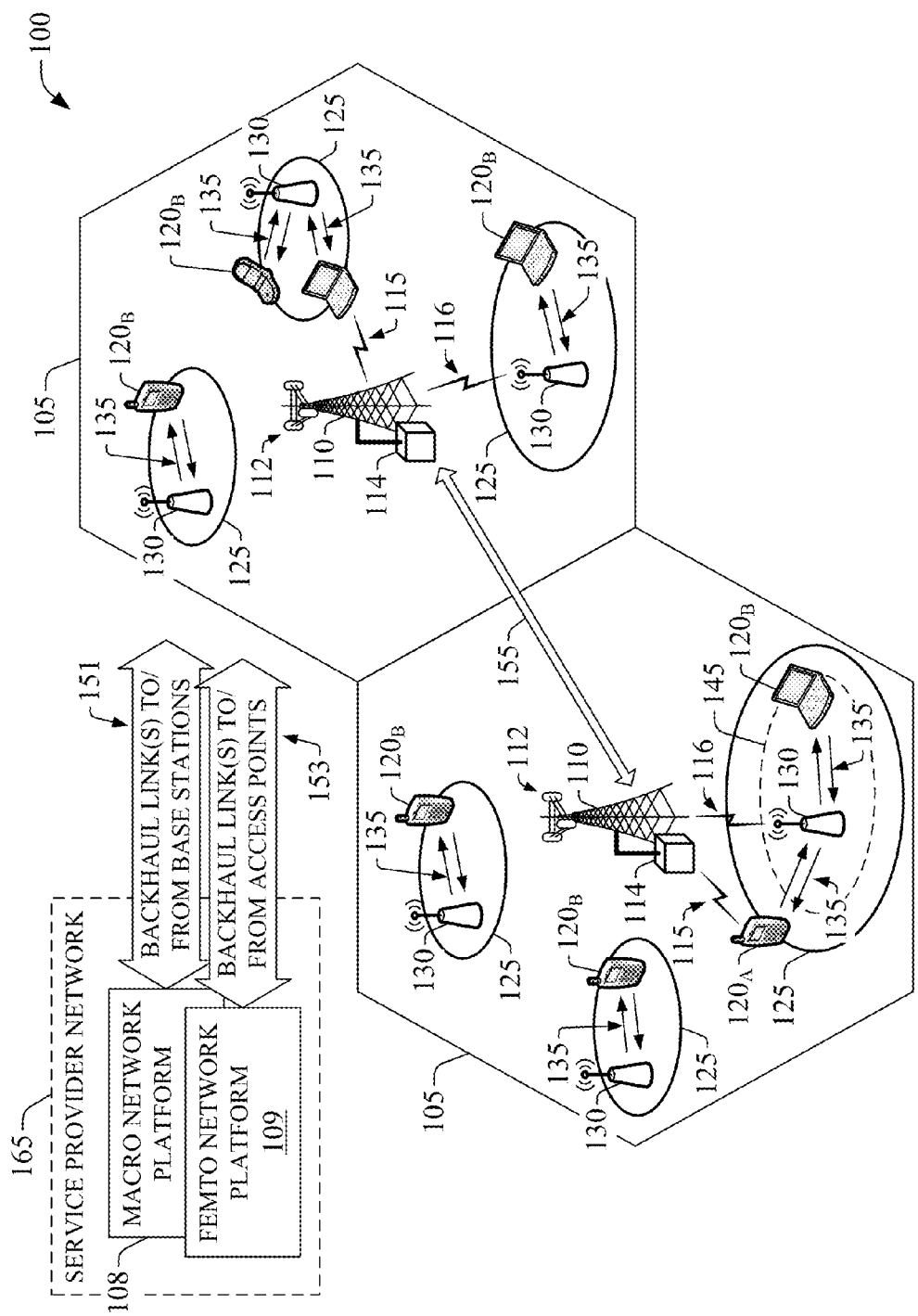
FIG. 1 illustrates a schematic deployment of a macro cells and femtocells for wireless coverage, wherein femtocell access points can exploit aspects described herein.

The subject innovation is now described with reference to the drawings, wherein like reference numerals are used to refer to like elements throughout. In the following description, for purposes of explanation, numerous specific details are set forth in order to provide a thorough understanding of the present innovation. It may be evident, however, that the present invention may be practiced without these specific details. In other instances, well-known structures and devices are shown in block diagram form in order to facilitate describing the present invention.

As used in this application, the terms "component," "system," "platform," "interface, node" and the like are intended to refer to a computer-related entity or an entity related to an operational apparatus with one or more specific functionalities, wherein the entity can be either hardware, a combination of hardware and software, software, or software in execution. As an example, a component may be, but is not limited to being, a process running on a processor, a processor, an object, an executable, a thread of execution, a program, and/or a computer. By way of illustration, both an application running on a server and the server can be a component. One or more components may reside within a process and/or thread of execution and a component may be localized on one computer and/or distributed between two or more computers. Also, these components can execute from various computer readable media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry which is operated by a software or firmware application executed by a processor, wherein the processor can be internal or external to the apparatus and executes at least a part of the software or firmware application. As yet another example, a component can be an apparatus that provides specific functionality through electronic components without mechanical parts, the electronic components can include a processor therein to execute software or firmware that confers at least in part the functionality of the electronic components.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form.

Moreover, terms like "user equipment," "mobile station," "mobile," subscriber station," "subscriber equipment," "access terminal," "terminal," "handset," and similar terminology, refer to a wireless device utilized by a subscriber or user of a wireless communication service to receive or convey data, control, voice, video, sound, gaming, or substantially any data-stream or signaling-stream. The foregoing terms are utilized interchangeably in the subject specification and related drawings. Likewise, the terms "access point;" "base station," "Node B;" "evolved Node B (eNode B);" "home Node B (HNB)" or "home access point (HAP)," which include femtocell access point, picocell access point, Wi-Fi base station, etc.; and the like, are utilized interchangeably in the subject application, and refer to a wireless network component or apparatus that serves and receives data, control, voice, video, sound, gaming, or substantially any data-stream or signaling-stream from a set of subscriber stations. Data and signaling streams can be packetized or frame-based flows. It is noted that context in the subject specification generally distinguishes among a base station that provides outdoor wireless coverage and a home access point (e.g., femtocell AP) that provides indoor wireless coverage; explicit distinction between indoor-serving AP and outdoor-serving base station is made when context may be insufficient to distinguish the utilized terms.

Furthermore, the terms "user," "subscriber," "customer," "consumer," "prosumer," "agent," and the like are employed interchangeably throughout the subject specification, unless context warrants particular distinction(s) among the terms. It should be appreciated that such terms can refer to human entities or automated components supported through artificial intelligence (e.g., a capacity to make inference based on complex mathematical formalisms) which can provide simulated vision, sound recognition and so forth. As utilized herein, the term "prosumer" indicate the following contractions: professional-consumer and producer-consumer.

The term "intelligence" as utilized herein with respect to a network refers to substantially any, or any, information that characterizes a wireless network or non-mobile network such for example, coverage area(s), operation marketplace(s), subscriber information, service offerings and associated promotional and advertising campaigns, commercial (e.g., sales, earnings, operational margins, costs) and non-commercial (community outreach, philanthropy . . . ) activities involving offered services or products, or the like. In connection with terminology employed to identify networks, mobile or otherwise, an "owned network," or the like, refers to the network that manages one or more components that perform the various functionalities described in the subject specification, a "competing network," "non-owned network," or the like, refers to one or more networks that share a market with the owned network.

Referring to the drawings, FIG. 1 illustrates a wireless environment that includes macro cells and femtocells for wireless coverage in accordance with aspects described herein. In wireless environment 100, two areas 105 represent "macro" cell coverage, each macro cell is served by a base station 110. It should be appreciated that macro cells 105 are illustrated as hexagons; however, macro cells can adopt other geometries generally dictated by deployment location(s) and surrounding terrain, geographic area(s) to be covered (e.g., a metropolitan statistical area (MSA) or rural statistical area (RSA)), and so on. Macro coverage is generally intended to serve mobile wireless devices, like UE $120_A$, in outdoors locations. An over-the-air wireless link 115 provides such coverage, the wireless link 115 comprises a downlink (DL) and an uplink (UL), and utilizes a predetermined band, licensed or unlicensed, of the radio frequency (RF) spectrum. As an example, UE $120_A$ can be a 3GPP Universal Mobile Telecommunication System (UMTS) mobile phone. It is noted that a set of base stations, its associated electronics, circuitry or components, base stations control component(s), and wireless links operated in accordance to respective base stations in the set of base stations form a radio access network (RAN). In addition, base station 110 communicates via backhaul link(s) 151 with a macro network platform 108, which in cellular wireless technologies (e.g., 3rd Generation Partnership Project (3GPP) Universal Mobile Telecommunication System (UMTS), Global System for Mobile Communication (GSM)) represents a core network.

In an aspect, macro network platform 108 controls a set of base stations 110 that serve either respective cells or a number of sectors within such cells. Base station 110 comprises radio equipment 114 for operation in one or more radio technologies, and a set of antennas 112 (e.g., smart antennas, microwave antennas, satellite dish(es) . . . ) that can serve one or more sectors within a macro cell 105. It is noted that a set of radio network control node(s), which can be a part of macro network platform; a set of base stations (e.g., Node B 110) that serve a set of macro cells 105; electronics, circuitry or components associated with the base stations in the set of base stations; a set of respective OTA wireless links (e.g., links 115 or 116) operated in accordance to a radio technology through the base stations; and backhaul link(s) 155 and 151 form a macro radio access network (RAN). Macro network platform 108 also communicates with other base stations (not shown) that serve other cells (not shown). Backhaul link(s) 151 can include a wired backbone link (e.g., optical fiber backbone, twisted-pair line, T1/E1 phone line, a digital subscriber line (DSL) either synchronous or asynchronous, an asymmetric ADSL, or a coaxial cable . . . ) or a wireless backbone link. Backhaul pipe(s) 155 link disparate base stations 110.

In wireless environment 100, within one or more macro cell(s) 105, a set of femtocells 125 served by respective femto access points (APs) 130 can be deployed. While in illustrative wireless environment 100 three femtocells are deployed per macro cell, aspects of the subject innovation are geared to femtocell deployments with substantive femto AP density, e.g., $10^4$-$10^7$ femto APs 130 per base station 110. A femtocell 125 typically covers an area that includes confined area 145, which is determined, at least in part, by transmission power allocated to femto AP 130, path loss, shadowing, and so forth. While coverage area 125 and confined area 145 typically coincide, it should be appreciated that in certain deployment scenarios, coverage area 125 can include an outdoor portion (e.g., a parking lot, a patio deck, a recreation area such as a swimming pool and nearby space) while area 145 spans an enclosed living space. Coverage area typically is spanned by a coverage radius that ranges from 20 to 100 meters. Confined coverage area 145 is generally associated with an indoor space such as a building, either residential (e.g., a house, a condominium, an apartment complex) or business (e.g., a library, a hospital, a retail store), which encompass a setting that can span about 5000 sq. ft.

A femto AP 130 typically serves a few (for example, 1-5) wireless devices (e.g., subscriber station $120_B$) within confined coverage area 125 via a wireless link 135 which encompasses a downlink (DL) and an uplink (UL). Femto AP 130 can receive signal from a base station 110 through wireless link 110. A femto network platform 109 can control such service, in addition to mobility handover from macro-to-femto handover and vice versa, and registration and provisioning of femto APs. Control, or management, is facilitated by backhaul link(s) 153 that connect deployed femto APs 130 with femto network platform 109. Backhaul pipe(s) 153 are substantially the same as backhaul link(s) 151. In an aspect of the subject innovation, part of the control effected by femto AP 130 measurements of radio link conditions and other performance metrics. Femto network platform 109 also includes components, e.g., nodes, gateways, and interfaces, that facilitates packet-switched (PS) (e.g., internet protocol (IP)) traffic and signaling generation for networked telecommunication. It should be appreciated that femto network platform 109 can be femto AP 130 can integrate seamlessly with substantially any packet switched (PS)-based and circuit switched (CS)-based network such as macro network platform 108. Thus, operation with a wireless device such as $120_A$ is substantially straightforward and seamless when handover from femto-to-macro, or vice versa, takes place. As an example, femto AP 130 can integrate into an existing 3GPP Core Network via conventional interfaces, or reference links, like Iu-CS, Iu-PS, Gi, Gn.

It is to be noted that substantially all voice or data active sessions associated with subscribers within femtocell coverage (e.g., area 125) are terminated once the femto AP 130 is shut down; in case of data sessions, data can be recovered at least in part through a buffer (e.g., a memory) associated with a femto gateway at the femto network platform. Coverage of a suspended or hotlined subscriber station or associated account can be blocked over the air-interface. However, if a suspended or hotlined customer who owns a femto AP 130 is in Hotline/Suspend status, there is no substantive impact to the customers covered through the subject femto AP 130. In another aspect, femto AP 130 can exploit high-speed downlink packet access either via an interface with macro network platform 108 or through femto network platform 109 in order to accomplish substantive bitrates.

In addition, in yet another aspect, femto AP 130 has a LAC (location area code) and RAC (routing area code) that is different from the underlying macro network. These LAC and RAC are used to identify subscriber station location for a variety of reasons, most notably to direct incoming voice and data traffic to appropriate paging transmitters, and emergency calls as well. As a subscriber station (e.g., UE $120_A$) that exploits macro coverage (e.g., cell 105) enters femto coverage (e.g., area 125), the subscriber station (e.g., UE $120_A$) attempts to attach to the femto AP 130 through transmission and reception of attachment signaling. The signaling is effected via DL/UL 135; in an aspect of the subject innovation, the attachment signaling can include a Location Area Update (LAU) and/or Routing Area Update (RAU). Attachment attempts are a part of procedures to ensure mobility, so voice calls and data sessions can be established and retained even after a macro-to-femto transition or vice versa. It is to be noted that UE $120_A$ can be employed seamlessly after either of the foregoing transitions. In addition, femto networks typically are designed to serve stationary or slow-moving traffic with reduced signaling loads compared to macro networks. A femto service provider network 165 (e.g., an entity that commercializes, deploys, or utilizes femto access point 130) is therefore inclined to minimize unnecessary LAU/RAU signaling activity at substantially any opportunity to do so, and through substantially any available means. It is to be noted that substantially any mitigation of unnecessary attachment signaling/control is advantageous for femtocell operation. Conversely, if not successful, UE $120_A$ is generally commanded (through a variety of communication means) to select another LAC/RAC or enter "emergency calls only" mode. It is to be appreciated that this attempt and handling process can occupy significant UE battery, and femto AP capacity and signaling resources (e.g., communication of pilot sequences) as well.

When an attachment attempt is successful, UE $120_A$ is allowed on femtocell 125, and incoming voice and data traffic are paged and routed to the subscriber through the femto AP 130. To facilitate voice and data routing, and control signaling as well, successful attachment can be recorded in a memory register, e.g., a Visited Location Register (VLR), or substantially any data structure stored in a network memory. It is to be noted also that packet communication (e.g., voice and data traffic, and signaling) is typically paged/routed through a backhaul broadband wired network backbone 140 (e.g., optical fiber backbone, twisted-pair line, T1/E1 phone line, digital subscriber line (DSL) either synchronous or asynchronous, an asymmetric DSL, a coaxial cable . . . ). To this end, femto AP 130 is typically connected to the broadband backhaul network backbone 140 via a broadband modem (not shown). In an aspect of the subject innovation, femto AP 130 can display status indicators for power; active broadband/ DSL connection; or any other type of backhaul connectivity; gateway connection; and generic or specific malfunction. In another aspect, no landline is necessary for femto AP 130 operation.

Figure 2:
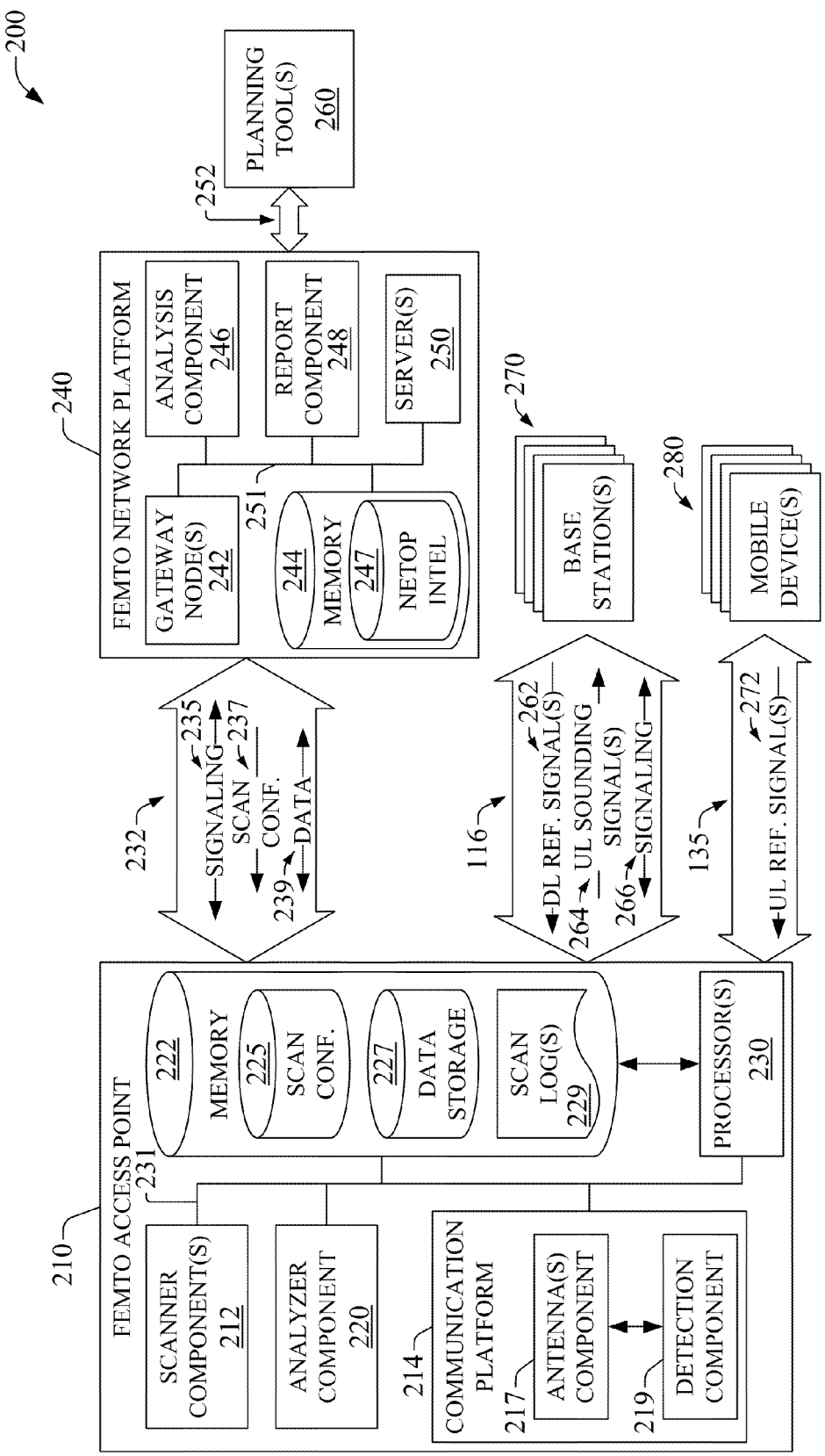
FIG. 2 illustrates a block diagram of an example system that enables collection of network operation data within a confined indoor wireless environment for generation of competitive network intelligence and strategic network planning at the macro-coverage level in accordance with aspects described herein.

FIG. 2 illustrates a block diagram of an example system 200 that enables collection of network operation data within a confined indoor wireless environment for generation of competitive network intelligence and strategic network planning at the macro-coverage level in accordance with aspects described herein. Femto network platform 240, or one or more components therein such as gateway node(s) 242, can command femto AP 210 to scan the macro wireless signals within the indoor environment and transmit collected data back to the gateway node(s) 242. In conventional systems, such scan activity and associated data is employed to determine optimal operating parameters (e.g., transmission frequency(ies), transmission power, code sequences, handover parameters, or the like) as part of automated configuration or re-configuration of a femto AP. Femto AP 210 scans and decodes signals associated with macro wireless coverage within the indoor wireless environment in which the femto AP operates. A scan conducted by femto AP, or any indoor-based access point, can survey and compare signals transported in a set of electromagnetic (EM) frequency bands, which can comprise radio frequency (RF) portion(s) and microwave portion(s) of the EM spectrum; and a set of radio technologies. Alternatively, or in addition, scanning of macro wireless environment can include scanning for specific system broadcast messages linked to specific technologies and conveyed through disparate frequency carriers. The set of EM frequency bands and radio technologies can be determined by an operator that manages the femto network that enable the scans; frequency bands, or frequency carriers therein, can be added to the set of EM frequency bands as such bands or carriers become available for communication, e.g., auctioned for utilization or cleared for free-of-charge utilization. Similarly, as new radio technologies become standardized, or available, such technologies can be introduced in the set of radio of technologies that is surveyed. Detected and decoded signals, e.g., collected data, can be processed, at least in part, and can be delivered to femto network platform 240 via backhaul link 232 as data 239. It should be appreciated that backhaul link 232 has substantially the same aspects or features of backhaul link(s) 153. Signals can include at least one of pilot signal(s) and system broadcast message(s), and traffic signal(s); it is noted that decoding of system broadcast message(s) can allow to determine network operational configuration such as sector identities, neighbor lists, or the like. Gateway node(s) 242 can receive the collected data 239 and supply the data to analysis component 246, which can process the data, at least in part, to generate network operations (NetOp) intelligence, which embodies at least a part of the competitive intelligence described hereinafter. In addition, report component 248 can administer at least one of data delivery, via link(s) 252, to planning tool(s) 260, which further produce competitive intelligence and develop strategic network planning. Aspects and features of scanning and data collection, as well as generation of network intelligence are described next.

Scanning of indoor wireless environment can proceed in at least two modes: (a) polling mode or (b) batch mode. (a) Polling mode.—Through delivery of a scan directive or request within signaling 235, femto network platform 240 instructs femto AP 210 to scan the indoor wireless environment. Directives can be conveyed periodically or in accordance to a schedule. In an aspect, in situations when scanning requires shutdown of the transmitter of femto AP 210, the schedule to convey a scan directive can include one or more times that substantially coincide, or coindice, with times for which historically operational data of femto AP 210 indicate that there are no attached customers or served traffic on the femto AP 210. Polling period $\tau$, or rate $\tau^{-1}$, is configurable and determined by femto network platform 240, or one or more components therein. Similarly, the polling schedule can be configured by femto network platform 240, or one or more components therein, with communication of scan directives through signaling 235 occurring at predetermined intervals. When a directive is received at femto AP 210, e.g., via at least in part communication platform 214, service load at the femtocell, or load of processor(s) 230, is evaluated and the directive is accepted or rejected. Evaluation can be based upon performance criteria (not shown) retained in memory 435 based at least in part on at least one of in-building service quality (e.g., signal strength originated from an owned network) or capacity (e.g., number of subscribers attached, scheduled traffic . . . ) of femto AP 210. Acceptance or rejection is indicated through signaling 235 via an ACK (acknowledge) or NACK (not acknowledge) signal; ACK/NACK can be embodied, for example, in one or more reserved bits in a packet header, a light-payload (e.g., of the order of 1 byte) data packet, a predetermined multi-bit word conveyed in a radio frame within a control channel, etc. Upon acceptance, gateway node(s) 242 can convey a scan configuration 237 that includes a set of measurements to be performed. Rejection can result in implementation of a retry cycle at the gateway node(s) 242 in which a predetermined number M, an integer, of scan directives are delivered at predetermined intervals until the directive is accepted or M attempts are completed.

(b) Batch mode.—In the subject mode, a received directive to scan is accepted and acknowledged without evaluation of performance conditions at substantially the time of received the request. After such acceptance, scanner component(s) 212 receives scan configuration 237, which includes a scan profile that determines a set of measurements to be performed. Additionally, scanner component(s) 212 autonomously places the scan directive in batch processing, scheduled to execute at a time that is inferred to satisfy femto AP 210 performance criteria for scanning the indoor wireless environment. Alternatively or in addition, scanner component(s) 212 can convey at least in part through communication platform 214 and via signaling 235 a request for a scanning schedule over a predetermined cycle, e.g., 8 hours, 24 hours, 1 week . . . . When such a schedule is received, e.g., as part of a scan configuration 237, scanner component(s) 212 can autonomously adjust the scheduled times to satisfy femto AP performance criteria, and can configure a batch process that when executed results in an indoor wireless scan at the scheduled times. At least one advantage of scanning in batch mode is that signaling between femto AP 210 and gateway node(s) 242 is substantially mitigated.

In polling mode or batch mode, it is noted that to the extent that performance criteria, e.g., in-building service quality or capacity, of femto AP 210 are fulfilled, scan measurements are taken during the substantially busiest periods of femtocell operation. In an aspect, a set of one or more processors in processor(s) 230 can be dedicated to operate, at least in part, scanner component(s), to mitigate performance degradation of femto AP 210 when measurement of wireless signals are collected. In addition, in batch mode, for example, some scan measurements as dictated by a received scan configuration 237 can be effected during light-traffic periods in order to contrast and ascertain "breathing" effect(s) of one or more networks under load—the "breathing" effect is reflected in a degradation of span of coverage area due to increase of load (e.g., rise over thermal (ROT)) and regulated transmission power of a served mobile device within the macro cell.

Wireless signals can originate from at least one of base station(s) 270 and mobile device(s) 280, and can be conveyed through over-the-air links 116 and 135, respectively. Two or more base stations 270 can serve respective two or more macro cells; each base station can serve more than one sector through utilization of smart antennas or antennas that can be configured to focus EM radiation onto disparate sectors. For base station(s) 270, scanner component(s) 212 can detect signals that include DL reference signal(s) 262 and signal strength report(s) in response to conveyed UL sounding signal(s) 264. For mobile device(s) 280, UL reference signal(s) can be detected. Scan of the indoor wireless environment surveys received wireless signals over a set of EM frequency bands that can include all EM frequency bands licensed by the service provider (e.g., personal communication services (PCS), advanced wireless services (AWS), general wireless communications service (GWCS), and so forth), all unlicensed frequency bands currently available for telecommunication (e.g., the 2.4 GHz industrial, medical and scientific (IMS) band or one or more of the 5 GHz set of bands), and all EM frequency bands in operation and not licensed to the service provider. Survey of such groups of EM frequency bands can allow collection of network operation data from network(s) operated by the service provider and network(s) operated by competing service providers. Additionally, the set of radio technologies surveyed during the scan of indoor wireless environment includes one or more telecommunication technologies such as Wi-Fi, WiMAX, 3GPP2 UMB, Enhanced GPRS, 3GPP UMTS, 3GPP LTE, HSPA, HSDPA, HSUPA, or LTE Advanced.

To conduct a scan, scanner component(s) 212 exploits at least in part communication platform 214, which can include antenna(s) component 217 and detection component 219. In an aspect, scanner component(s) 212 can configure a transceiver component (not shown) in antenna(s) component 217 to collect signal in a specific frequency carrier, e.g., frequency channel. Such configuration can allow determination of downlink (DL) carrier frequency, or channel number. Additionally, scanner component(s) 212 can configure demodulation and demultiplexing operation of detection component 219 in accordance with standard protocols associated with the plurality of disparate telecommunication technologies that are surveyed; in an aspect, the various protocols and instructions necessary for implementation thereof can reside in memory 222. Thus, demodulation and demultiplexing configuration enable determination of radio technology employed in DL signal (e.g., DL reference signal(s) 262) or UL signal (e.g., UL reference signal(s) 272). It is noted that communication platform 214 includes circuitry, e.g., one or more chipsets, and at least a portion of one or more processors to switch radio technologies (e.g., IS-95, WiMAX . . . ) within a configurable and upgradable set of technologies in order to effect telecommunication and enable a scan (e.g., decoding or deciphering of signal(s)) in accordance with configured demodulation and demultiplexing associated with a radio technology. Such technology agility can afford blind determination, e.g., identification by inspection, of a radio technology employed for communication within the indoor wireless environment. It is noted that communication platform 214 also can receive global positioning system (GPS) timing information from one or more deployed global navigation satellite systems (GNNSs).

Scanner component(s) 212 can decode received wireless signals and thus determine at least one of a network identity (e.g., public land mobile network (PLMN), a mobile network code (MNC) and associated mobile country code (MCC)), a cell site identity (e.g., a cell global identity (CGI) or macro sector identifier. It is noted that, in an aspect, scanner component(s) 212 do not decode UL or DL subscriber data content sent to or from a scanner, e.g., measured, network or user elements. In specific scenarios, a subscriber-based privacy policy (e.g., privacy policy 316) can allow scanning of traffic at a femto AP. In an aspect, the identifier can be a numeric index that characterizes a pilot code sequence, e.g., a Zadoff-Chu sequence, or an M-sequence. Decoding can be based at least in part on blind decoding of received signal(s), computation of log-likelihood ratios (LLR) associated with constellation realization for a specific demodulation; maximum likelihood (ML) estimation, minimum mean square equalization (MMSE), zero forcing (ZF) filtering, or maximal ratio combining (MRC) filtering. To determine code sequences and thus one or more of the foregoing identities or identifiers, scanner component(s) 212 can compute cross-correlation of decoded signal(s) and a set of code sequence hypotheses for the various radio technologies included in the set of technologies surveyed by scanner component(s) 212. Code sequences can include at least one of a scrambling code, a pseudonoise (PN) sequence, a chirp-like sequence, and so forth. Code sequence hypotheses (not shown in FIG. 2) can be retained in memory 222. When a code sequence has been determined, an index that identifies, for example, a decoded scrambling code can be established as a cell identifier or sector identifier, or a base station identity code (BSIC); the index can be a composite index based at least in part on the type of decoded sequence. Scanner component(s) 212 can identify a plurality of networks and macro sectors.

Scanner component(s) 212 also can gather data on DL signal strength and quality associated with identified cell or sectors and related networks. To at least that end, scanner component(s) 212 can gather DL reference signal(s) 262 and analyze such signal(s) to determine DL channel quality or strength; analysis can be conducted through analyzer component 220, or one or more components therein. In an aspect, signal strength can be determined through received signal strength indicators (RSSIs) or received signal code power (RSCP), while quality can be assessed through metrics such as signal-to-noise ratio (SNR), signal-to-noise-and-interference ratio (SNIR), or energy per chip over total received power ($E_c/N_0$).

Uplink data originated at mobile device(s) 280 also can be gathered. In an aspect, collected UL data can comprise uplink noise (e.g., ROT), or the number of unique user equipment detected within a specified signal strength band and time interval (e.g., historically low-traffic period(s) or historically high-traffic period(s). Decode unique identifier(s) can include an international mobile subscriber identity (IMSI), an international mobile equipment identifier (IMEI), a mobile directory number (MDN), a mobile identification number (MIN), a Telecommunications Industry Association (TIA) electronic serial number (ESN), or a multi-bit identification number like the mobile identity number (MEID). Scanner component(s) 212 also can convey, through communication platform 214, UL sounding signal(s) 264 to a group of one or more identified base stations that serve one or more of the identified sectors, which communicate with femto AP 130 through links 115, and receive UL signal quality report(s) associated with the conveyed sounding signal(s). Such reports can (i) be embodied in a short message service (SMS) communication, an unstructured supplementary service data (USSD) message, or in one or more bits in at least one of control channel (s), data packet header(s), management frame(s), or management packet(s), and (ii) received through signaling 266.

It is noted that scanner component(s) 212 also can be employed during provisioning of femto AP 210 for scanning directed to adapting the femto AP to operational conditions of a serving network; scanner component(s) 212 also can conduct scans when serving network is updated or otherwise changed. To suit universal applications, such scans measure multiple frequency bands and radio technologies to build a complete macro coverage assessment for setting of optimal power transmission, Location Areas, Routing Areas, scrambling codes and handover neighbor lists. It is noted that provisioning scans and scans to adapt to network updates are typically infrequent.

Network operation data measured by scanner component (s) 212, which comprises DL/UL radio link quality and strength in addition to information that characterizes identified cells or sector(s) such as code identifiers or radio technology, can be collected in data storage 227. In addition, scanner component(s) 212 can retain, in data storage 227, timestamps with high granularity associated with collected data during a scan of indoor of wireless environment, or indoor competitive network survey. To generate timestamps against scanned and recorded signal(s), scanner component (s) 212, individually or at least in partial conjunction with ore more components within femto AP 212, can exploit timing from a connected GPS antenna that can be functionally coupled to femto network platform 240 and can convey timing data through link 232. In an aspect, such timestamps can be placed on the receipt of signaling messages from base stations not owned by a network operator that administers femto network platform 240 and associated femto APs.

In an aspect, to supplement timestamped data and enable extraction of location-based information associated radio transmission resources of a competing network, scanner component(s) 212, assisted at least in part through communication platform 214, can conduct signaling time-of-flight (TOF) measurements such as measurements of round trip time (RTT), or measurement of time difference of arrival (TDOA).

Analyzer component 220 can process, at least in part, and compile the collected network operation data. Analyzer component 220 also can schedule analysis in order to mitigate excessive processing load at processor(s) 230. In multi-processor femto APs, data analysis can be implemented via one or more dedicated processors within processor(s) 230. Compiled data that arises from one or more scans can be retained in memory 222, within data storage 227, prior to delivery to gateway node(s) 242 in accordance with a pre-defined schedule during non-busy periods. It should be appreciated that scheduling collected, compiled data traffic in backhaul link (s), e.g., link(s) 153, during light-traffic or non-busy periods can significantly improve operation of the femto AP 210 in with respect to asynchronous, unscheduled delivery of collected data. In an aspect, gateway node(s) 242 can schedule delivery of data 239 in order to avoid excessive UL traffic in backhaul link 232 and excessive processor load at gateway node(s) 242 or at server(s) 250, which can confer, at least in part, functionality to the gateway node(s) 242. A delivery schedule can be conveyed to femto AP 210 as part of a scan configuration 237. Alternatively or additionally, in another aspect, scanner component(s) 212 can schedule delivery of collected, compiled network operation data. Delivery schedule(s) configured, or defined, at the femto AP can better exploit utilization of historical data on mobile device attachment and served traffic to generate such schedule.

In an aspect of the subject innovation, in response to a scan directive or upon completion of a scan, scanner component(s) 212 can generate a scan log and retain it in scan log(s) 229 within memory 222. Scan log(s) can enable, at least in part, to perform at least one of data analysis, such as root cause analysis, or organize historical data.

Network operation data gathered by a set of femto APs, which includes femto AP 210, and received at gateway node(s) 242 can be retained in network operations (NetOp) intelligence 247. In addition, aggregated and analyzed data also can be retained in NetOp intelligence 247. Aggregation and data processing of received data can be implemented by analysis component 246. Analysis includes generation of operation metrics that allow, at least in part, evaluation of a wireless network strengths and weaknesses. It should be appreciated that NetOp intelligence 247 can include aspects of network operation for disparate marketplaces since the set of femto APs that collect data can be provisioned in disparate location that are known to a service provider that operates the set of femto APs. Accordingly, NetOp intelligence 247 can be integrated with marketplace information, e.g., customer segment(s), service segment(s), economic indicators, or the like, to afford various strategic campaigns such as sales activities. It is noted that NetOp intelligence 247 is generated from compilation and aggregation of data originated from a substantive set of femto APs and thus represents actionable information that can allow at least one of advantageous modeling of network operation and automatic cell deployment planning and frequency planning.

To exploit NetOp intelligence 247, femto network platform 240 includes a report component 248 that can relay stored data to network planning tool(s) 260, which can be offline and functionally connected to femto network platform 240 through wireless or wired link(s) 252; e.g., one or more reference links. Planning tool(s) 260 can be part of external network(s) that can be integrated with femto network platform 240. In another aspect, planning tool(s) 260 can consume NetOp intelligence 247 to automatically provide, at least in part, at least one of traffic or call session (e.g., data or voice) models; cell site growth predictions; cell and frequency reuse planning; coverage planning; location-based service development; promotional and sales campaigns design; or the like.

In example system 200, femto access point 210 includes one or more processor(s) 230 which is configured to confer, and confers, at least in part, the described functionality of the various components included in femto AP 210. To confer such functionality, processor(s) 230 can exploit, at list in part, bus 231, which can embody at least one of a memory bus, a system bus, or an address bus, for data or any other information exchange. Processor(s) 230 can execute code instructions (not shown) stored in memory 222, or a memory component or element therein, to provide the described functionality of the femto AP 210 and component(s) therein. It should be appreciated that processor(s) 230 can be a centralized element or be distributed among the various referenced components.

Additionally, server(s) 250 include at least one of one or more processors; a system bus and a memory bus; and one or more memories, volatile or otherwise, and can be functionally connected to each component in femto network platform 240. Server(s) 250 can include ports for wireless or wired functional connection with such components or peripheral devices. Server(s) 250 can confer, and confer, at least in part, the described functionality of each of such components and components therein. Server(s) 250 can connect to the components comprised in femto network platform 240 through bus 253, which can embody at least one of a memory bus, a system bus, or an address bus, for data or any other information exchange. Additionally or alternatively, server(s) 222 can execute one or more of the components included within femto network platform 240. Moreover, or as another alternative, one or more components that comprise femto network platform 240 can reside within server(s) 250. Server(s) 222, can execute, e.g., through the at least one processor therein, code instructions stored in a memory, e.g., memory 244, to provide at least in part the functionality of one or more of the components that reside within femto network platform 240.

At least one advantage of network intelligence generation through scanning of indoor wireless environments through a femto access point is that scanner receivers are part of conventional femto APs. Thus, introduction of scanner component(s) 212 and communication platform 214 to conduct network survey(s) as described herein maintains to a substantial extent the complexity of femtocells, with the ensuing cost mitigation and low-threshold adoption of femto APs described herein. It is noted that the degree to which complexity of femto APs is retained can be determined at least in part upon the degree convergence of operational protocol(s) and standard(s) of various radio communication technologies. For instance, a converged radio technology can require a consolidated, simplified scanner component(s) 212 and communication platform 214, and associated chipset(s). Alternatively, or in addition, partially-converged or non-converged radio technologies can require a set of dedicated chipsets to enable scanning of respective non-converged radio technologies.

At least another advantage of network intelligence generation through scanning of indoor wireless environments is that it provides information on indoor coverage afforded by competing operator(s), wherein the information has been generally deemed unavailable or impractical to collect trough conventional techniques or methods. Moreover, generated network intelligence can provide intra-network information that can allow, at least in part, strategic planning related to cell site growth and coverage development such as frequency tuning and bandwidth pursuit, e.g., bidding plans for auctioned EM spectrum.

At least a further advantage of indoor competitive network survey as described in the subject innovation, is that the subject scanning features or aspects provide network operation data from a substantially large number ($10^5$-$10^7$) of femto APs, particularly in complex femtocell networks with residential and business deployments, the data can be aggregated and integrated with location information for the femto APs in the set of femto APs to generate a substantially complete competitive indoor coverage scenario. Such coverage scenario for indoor service quality is critical to network operator (s) that pursues service development, improved quality of extant deployed operations, and enhanced cost margins associated with service and development thereof.

Figure 3:
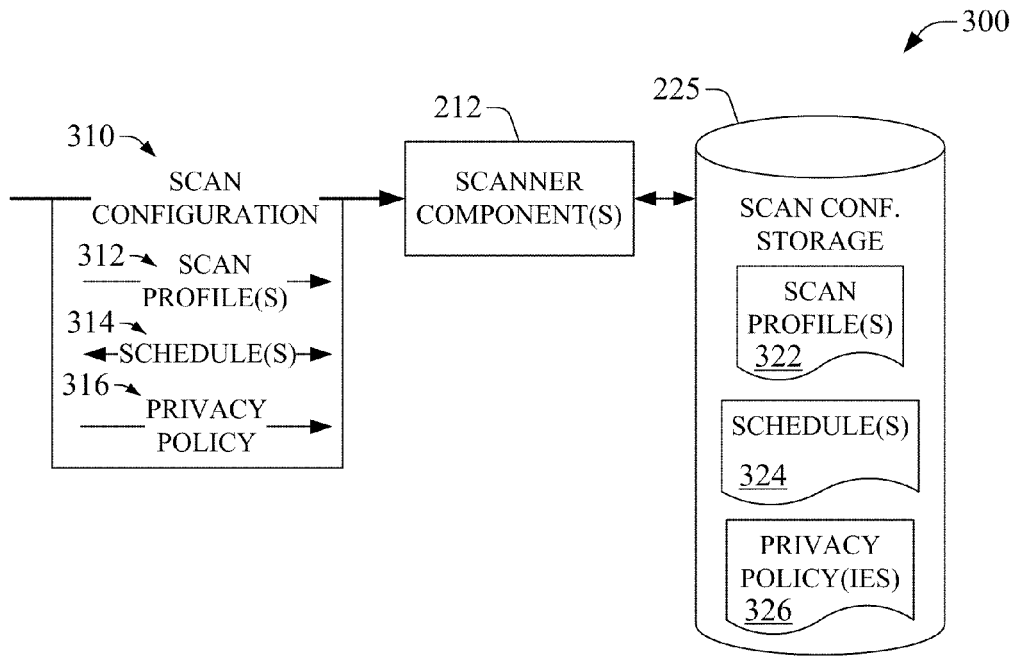
FIG. 3 displays a diagram of an example scan configuration and scan configuration storage in accordance with aspects described herein.

FIG. 3 displays a diagram 300 of example scan configuration and scan configuration storage in accordance with aspects described herein. Scan configuration 310 can include at least one scan profile(s) 312, schedule(s) 314, or privacy policy 316. It should be appreciated that contents of scan configuration 310 can be specific to a femto AP, or any other indoor-base AP, that performs the scanning, and the contents can be dictated at least in part by scan mode, e.g., polling mode or batch mode. Scan profile(s) 312 convey a set of measurements to be performed during a scan of indoor wireless environment, and are part of scan configuration in either polling mode or batch mode. It is noted that the set of measurements conveyed in a scan profile 312 can be at least one of an original set or a set previously received.

Schedule(s) 314 can be received in polling mode or batch mode. In an aspect, in polling mode, schedule(s) 314 can indicate a set of times at which compiled, collected network operation data is to be delivered to gateway node(s) 242 within femto network platform 240; the set of times can be defined within a data collection cycle; e.g., an hour, a day, a week . . . . It should be appreciated that when generation of delivery schedule is performed in femto AP 210, a received delivery schedule 314 can be overridden by scanner component(s) 212. Alternatively or additionally, to reduce signaling load, scanner component(s) 212 can signal, at least in part through communication platform 214 and via signaling 235, that a delivery schedule, as part of schedule(s) 314, is not to be delivered when femto AP 210 configures such schedules locally. In batch mode, schedule(s) 314 can convey a set of times at which to scan an indoor wireless environment. In batch mode, schedule(s) 314 also can include delivery schedule(s), which are administer in substantially the same manner as in polling mode and described hereinbefore.

As indicated above, scan configuration 310 also can include a privacy policy 316, which can override at least one of a scan schedule in batch mode, or a delivery schedule configured by either femto AP 210, via scanner component 212, or gateway node(s) 242. A subscriber that access wireless service through the femto AP that scans the indoor wireless environment can configure privacy policy 310. To reduce signaling load, privacy policy 316 can be included in scan configuration 310 at an initial scan subsequent to provisioning of a femto AP, or upon changes effected to an existing privacy policy.

As discussed supra, scanner component(s) 212 can receive scan configuration 310 and retain at least a portion of contents of received scan configuration 310 in scan configuration storage 330 within at least one of the following memory elements: scan profile(s) 322, schedule(s) 324, or privacy policy (ies) 326.

Figure 4:
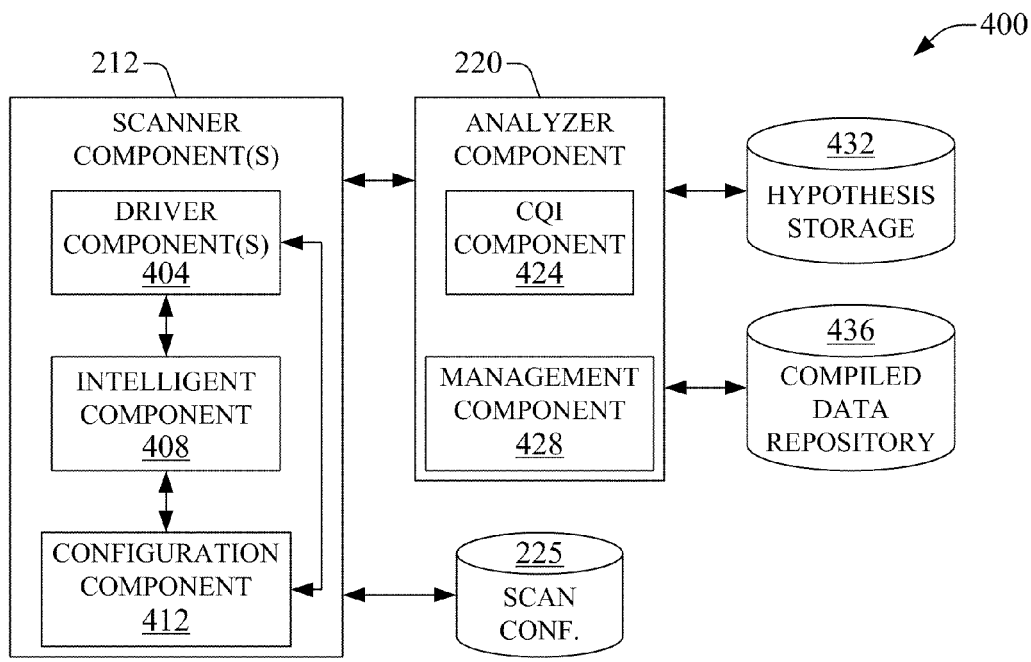
FIG. 4 displays example an embodiment of scanner component(s) and analyzer component, and associated information storages in accordance with aspects described herein.

FIG. 4 displays example an embodiment 400 of scanner component(s) and analyzer component, and associated information storages in accordance with aspects described herein. Scanner component(s) 212 can include driver component(s) 404 that can utilize detection component 219 (not shown in FIG. 4) to perform measurement as determined via scan configuration(s) retained in scan configuration storage 225. In addition, driver component(s) 404 can store collected data in data storage 227 (not shown in FIG. 4), and transmit retained data in accordance with a delivery schedule, e.g., schedule(s) 314. Driver component(s) 404 also can signal configuration component 412 to set detection component 219 to collect data in accordance with specific protocol(s) related to a selected radio technology. Various protocols can be retained in hypothesis storage 432, and driver component(s) 404 can select one or more of the various protocols to detect signal received in accordance to disparate radio technologies.

Configuration component 412 also can set a femto AP in scanning mode prior to collection of data in accordance with a scan profile retained in scan configuration storage 225. To at least that end, configuration component 412 can determine if a set of performance criteria for the femto AP quality of service is fulfilled prior to configuration of femto AP in scan mode. Configuration component 412 can utilize intelligent component 408 to establish, at least in part, (1) a suitable time to conduct a scan when a polling-mode scan request is declined, or (2) a scanning schedule for batch-mode scanning that can effect a scanning while satisfying the performance criteria. Likewise, configuration component 412 can exploit intelligent component 408 to set a delivery schedule that allows to convey collected data during low-volume traffic periods. In an aspect, intelligent component 408 can exploit historical data on traffic and signaling related to wireless service provided through femto AP to enable determination of suitable scan schedules or delivery schedules. In an aspect, a delivery schedule can be retained as part of a retention protocol (not shown) for collected data, the retention protocol stored in memory 222.

Intelligent component 408 also can exploit artificial intelligence (AI) methods to infer (e.g., reason and draw a conclusion based upon a set of metrics, arguments, or known outcomes in controlled scenarios) a delivery schedule based on historical data on backhaul traffic associated with a femto AP, or any indoor-based AP, or a scan schedule based on quality of service targets related to the femto AP and historical features of service(s) provided by the femto AP. In addition, AI methods can be employed to optimize a utility trade-off between the cost of performing a scan a collected network operation data and the benefit there from in order to accept or decline a received scan directive.

Artificial intelligence techniques typically apply advanced mathematical algorithms—e.g., decision trees, neural networks, regression analysis, principal component analysis (PCA) for feature and pattern extraction, cluster analysis, genetic algorithm, or reinforced learning—to a data set. In particular, analysis component 218, or components therein, can employ one of numerous methodologies for learning from data and then drawing inferences from the models so constructed. Such methodologies can be retained in memory 222. For example, Hidden Markov Models (HMMs) and related prototypical dependency models can be employed. General probabilistic graphical models, such as Dempster-Shafer networks and Bayesian networks like those created by structure search using a Bayesian model score or approximation can also be utilized. In addition, linear classifiers, such as support vector machines (SVMs), non-linear classifiers like methods referred to as "neural network" methodologies, fuzzy logic methodologies can also be employed. Moreover, game theoretic models (e.g., game trees, game matrices, pure and mixed strategies, utility algorithms, Nash equilibria, evolutionary game theory, etc.) and other approaches that perform data fusion, etc., can be exploited.

Analyzer component 220 can process measured data to identify sectors or cells, radio technologies, and associated network operators as identified, for example, through a network color code (NCC). In an aspect, part of the processing, as described above, includes blind decoding of received pilot signals, the decoding can exploit at least in part code sequences retained in hypothesis storage 432. Analyzer component 220 includes a CQI (channel quality indicator) component 424 that can evaluate quality of strength of wireless signals measured as part of scanning the indoor wireless environment. CQI component 424 also can analyze noise measurements, to extract noise features such as spectral profile, noise amplitude, statistics, etc. In addition, analyzer component 220 can include a management component 428 that manipulates and administers measured data. Data administration can include at least one of data compilation of data into consolidated databases of related data, generation of backup storage, data encryption for secure submission to a femto gateway node, data removal, or the like. Management component retains manipulated data in compiled data repository 436. In an aspect, generation of backup storage or data removal can proceed in accordance with a configurable data protocol (not shown) retained in memory 222.

As described in connection with FIG. 2, components and memory elements in example embodiment 400 can communicate through bus 231. In addition, one or more processor(s) 230 (not shown in FIG. 4) is configured to confer, and confers, at least in part, the described functionality of the various components included in example embodiment 400. Processor (s) 230 can execute code instructions (not shown) stored in memory 222, or a memory component or element therein, to provide the described functionality of the femto AP 210 and component(s) therein. It is noted that scan configuration storage 225, hypothesis storage 432, and compiled data repository 436 can be retained within memory 222.

Figure 5:
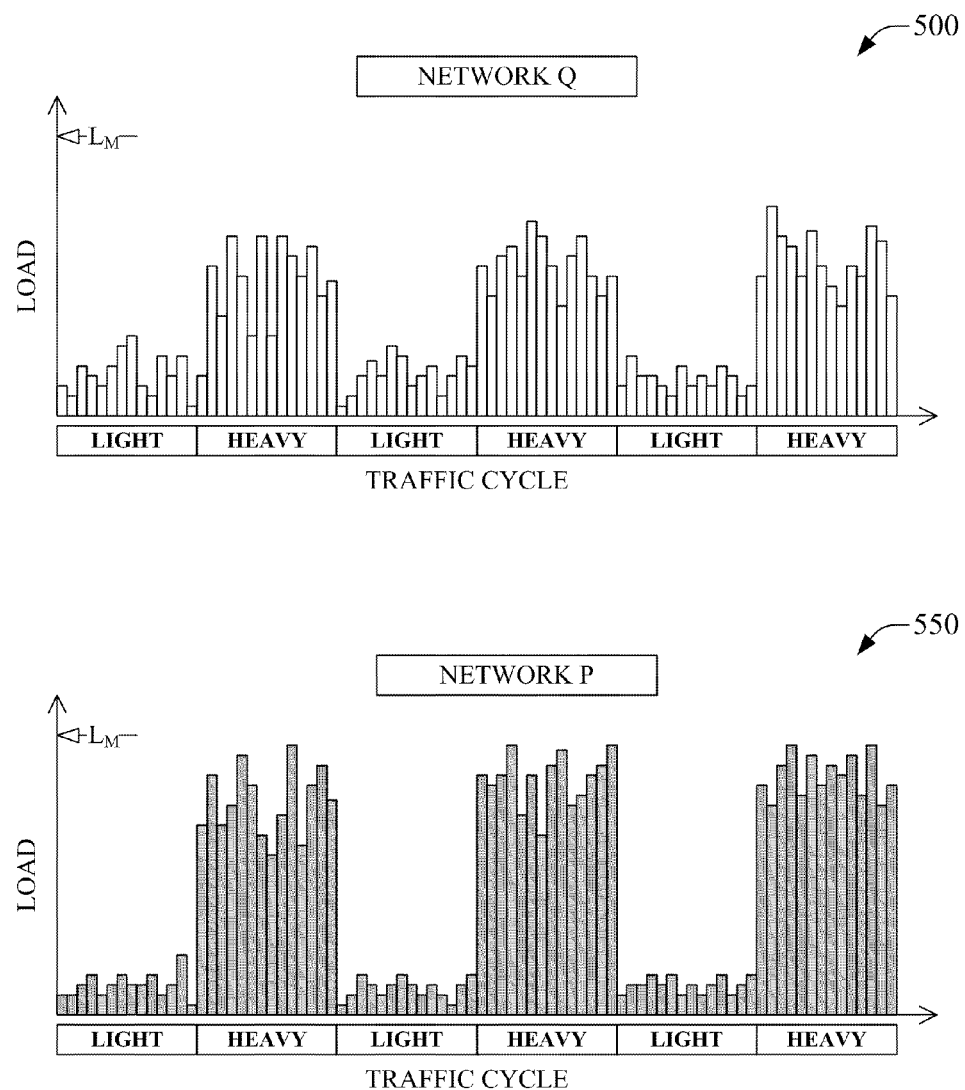
FIG. 5 exhibits diagrams of load as a function of traffic cycle for disparate networks in accordance with aspects described herein.

FIG. 5 exhibits diagrams 500 and 550 of load as a function of traffic cycle. Load is probed through wireless scans as described herein. Fourteen scan events in light traffic cycle and heavy traffic cycle probe load for a network Q and a network P. Load can be measured as ROT; however, other load metrics can be employed such as number of UEs operating in a specific sector. As illustrated, network Q has lower "breathing," or lower dynamic range, than network P. Thus, network P can display a higher reduction in effective wireless coverage span and thus lower performance than network Q. Cell breathing data can be employed to optimize power allocation, antenna configuration, and the like near the femto AP employed to collect measurements.

Figure 6:
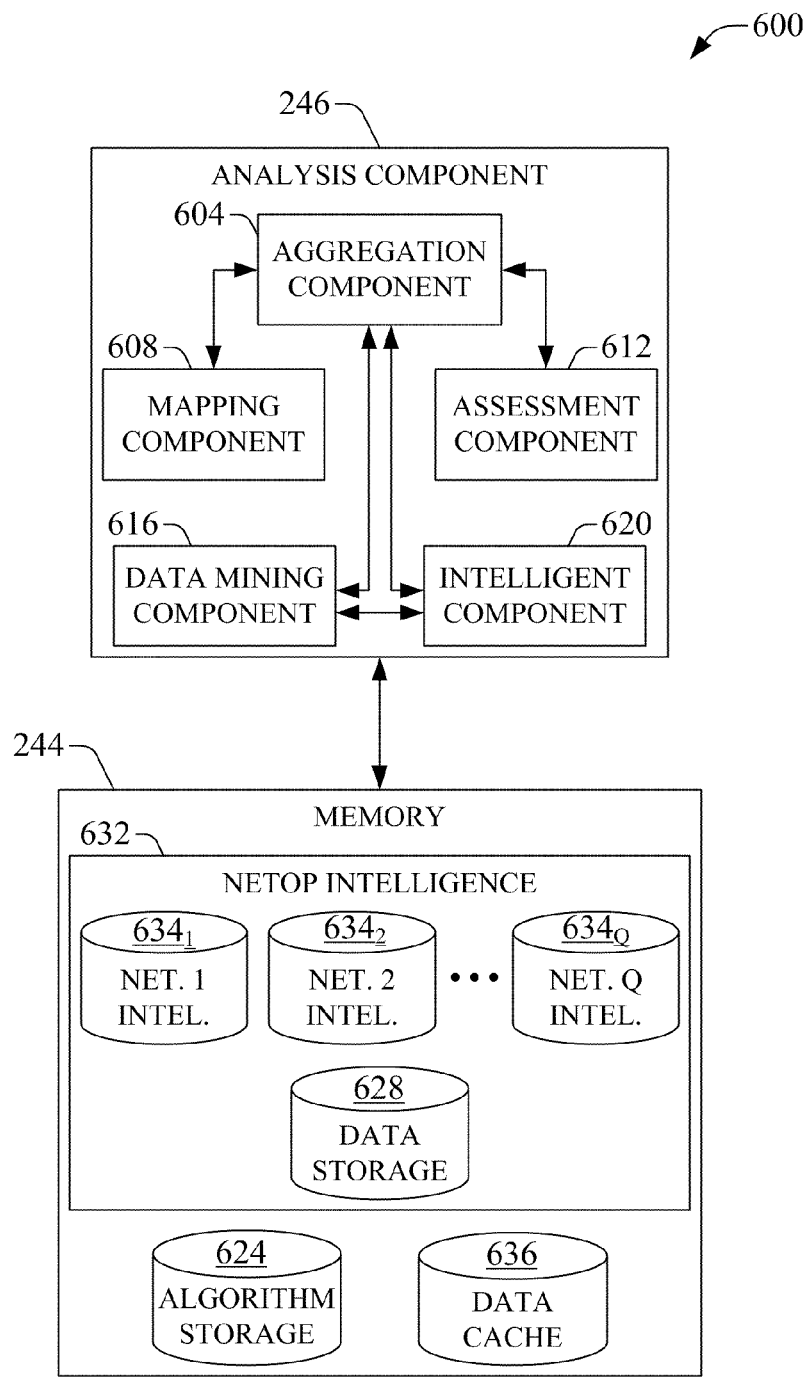
FIG. 6 is displays a block diagram of an example embodiment of an analysis component in accordance with aspects disclosed herein.

FIG. 6 displays a block diagram 600 of an example embodiment of an analysis component 246 in accordance with aspects disclosed herein. As indicated above, analysis component 246 receives data, e.g., through gateway node(s) 242, from a set of femto APs and analyzes the data. The number $N_{AP}$ (an integer) of femto APs in the set is determined primarily by processing capacity of one or more server(s) in femto network platform. As an example, $N_{AP}$ can range from $10^3$ to $10^5$. However, data from most any number of femto APs can be received and aggregated at component 604. Aggregation component 604 can receive data collected from scans of indoor wireless environment performed in a set of femto access points, and retain the data in NetOp intelligence 632. In addition, aggregation component 604 can exploit mapping component and assessment component 612 to summarize, at least in part, the received data. Such data also can be categorized. In one or more additional or alternative embodiments of analysis component 218, mapping component 608 or assessment component 612, or both, can resided within aggregation component 604.

Mapping component 608 can associate collected data with location of a femto access point that generated the data. Intelligence, or information, can be retained in NetOp intelligence 632. Location can be characterized through at least one of a geocode; a ZIP code; or a longitude, latitude and altitude. Location of the femto AP can be extracted from at least one of a subscriber database (e.g., home subscriber server), a provisioning database that includes a femtocell identifier (ID), or an external location intelligence repository such as a location based service. It should be appreciated that location of a femto AP or any indoor AP (e.g., Wi-Fi HAP) can be collected, for example, at the time of provisioning the femto AP or the indoor AP for service. In addition, mapping component 608 can aggregate global positioning system (GPS) time-stamped information received from a set of femto APs to locate and record competitor networks' unique transmission locations. In an aspect, femto AP, or any other indoor-based receiver, with a built-in GPS receiver and that conducts the scan of indoor wireless environment, can time stamp collected data. It is noted that a femto AP (e.g., 210) with a built-in GPS receiver employs the same radio timing source as networks of several competing operators; thus, when the femto AP measures multiple base stations that operated in a specific mode (for example 1X-RTT), such femto AP can calculate timing offset and relative distance from one or more of the measured base stations. In a GPS-enabled femto AP 210, calculation of timing-offset can be effected by analyzer component 220. Upon receipt of this location-based data from a constellation, or set, of several GPS-enabled femto APs that scan a wireless environment, analysis component 246 via at least in part mapping component 608 can generate a distance roster, or registry, or location hypotheses of base station operated by a competing network. Moreover, mapping component 608 can link received and generated data to at least one of a pertinent network operator, a sector identifier, or a sector carrier, in order to create one or more views of data records retained in one or more databases, or other data structures, in NetOp intelligence storage 632. Mapping of received data, and data generated there from (e.g., location roster(s)), to network operator can generate, at least in part, a set of Q network intelligence repositories $634_1$-$634_Q$.

Assessment component 612 can operate on received or aggregated data to generate various network performance, or operation, metrics. Such metrics are part of generated network operation intelligence, and can be extensive or intensive; e.g., the metric can depend on size of assessed network or network coverage. In an aspect, with respect to extensive operation metrics, assessment component 612 can determine at least one of a number of unique sector identifiers per network operator or a number of unique sector carriers per operator, and retain such information in a respective network intelligence repository, e.g., network intelligence $634_Q$, in memory element 632.

In another aspect, in connection with intensive operation metrics, assessment component 612 can establish one or more of (i) a site density, a (ii) capacity density, (iii) coverage density, or (iv) a traffic density. (i) Site density is the number $N_{SI}^{(Op)}$ of unique sector identifiers (SI) per network operator (Op). Such metric compares at least in part the relative degree of investment committed by disparate operators in a marketplace in which data is measured, e.g., the location in which an indoor AP conducts scan(s) of a wireless environment. (ii) Capacity density is defined as $N_{SC}^{(Op)}/\Delta v_C$, where $N_{SC}^{(Op)}$ is the number of unique sector carriers (SCs) per operator and $\Delta v_C$ is the carrier's bandwidth. Capacity density also compares at least in part investment committed by network operator. (iii) Coverage density is defined as the average signal strength per operator, wherein the average can be computed as an arithmetic mean or a geometric mean of the amplitude of signal collected over a predetermined time interval or a sampling interval. It should be noted that averages computed over a sampling interval (e.g., a minute, an hour, a day, a week . . . ) are moving or rolling averages. Rolling averages can be utilized to computer averages over the predetermined time interval. Averages can be weighted averages. (iv) Traffic density is the ratio $\eta_{UL}/N$, where $\eta_{UL}$ is UL noise and N is the number of unique mobile devices detected in a time interval. Time interval can span historically low-traffic intervals or historically high-traffic intervals. Such historical information can be received as part of the collected data, and an originating femto AP can establish high-traffic and low-traffic periods. Alternatively or additionally, a service provider that operates a femto network platform that manages the femto AP that originates the data can determine high-traffic and low-traffic periods based at least in part on macro network operation data extracted from a source disparate to the femto AP.

In yet another aspect, assessment component 612 can generate, at least in part, a set of network interference matrices, wherein one or more matrices originate from interference measurements related to one or more network operators. Measurements of unique macro sector carriers can allow composing of a matrix of mutual interference between such carriers.

Analysis component 246 also can include a data mining component 616 that can enable, at least in part, aggregation of received data and the various operations of mapping component 608 and assessment component 612. Data mining component 616 can extract data from data storage 628 and can supply the data to aggregation component 604, which can process the data or relay the data to mapping component 608 and assessment component 612 for generation of network intelligence as described above. Data mining component 616 can exploit, at least in part, intelligent component 620 in order to at least extract spatial and temporal correlations between data or identify data patterns, which can include location-based network operation patterns. Intelligent component 620 can exploit AI methods such as those described above in connection with intelligent component 408.

In an aspect, through utilization of at least one of aggregated data or network intelligence, intelligent component 620 can generate customer segment(s) or service segment(s) associated with various marketplaces in which one or more set of femto APs, or any sets of indoor base stations, can gather data through scan of confined wireless environments as described herein.

Analysis component 246, and one or more components therein, can utilize algorithm(s) retained in memory element 624 in addition to at least a portion of data stored in data cache 636, to implement at least a portion of the various, previously described operations on received or aggregated data, e.g., mapping, assessment, data mining, classification and segmentation, and so forth. It should be appreciated that data cache 636 also can be external to data storage 628 or memory 244. Algorithm(s) retained in memory element 624 also includes at least one mathematical algorithm for analysis of time series originated from disparate femto AP and associated scan(s) of a wireless environment. When implemented, e.g., executed by a processor, such retained algorithm(s) can implement, at least in part, computation of statistics (e.g., averages, variances and standard deviations, covariance matrices . . . ); generation of database views, e.g., specific subsets of data; extraction and representation of data connectivity; transformation of data for spectral analysis thereof based upon Fourier transformation, wavelet transformation, . . . ; or the like.

Algorithm(s) in algorithm storage 624 also can include algorithms that when implemented, e.g., executed by a processor, can afford to compress and extract data, or generate log records of data manipulation such as generation of network intelligence, creation of databases and new record views, or the like. Data compression can be accomplished at least in part via lossless data compression, which can be employed for received data that is deemed critical or strategic, or lossy compression for data that is readily available.

Data stored in data cache 636 can serve as a training set for generation of models of network operation, e.g., such as traffic development, marketplace exploitation, and so forth. Contents of data cache 636 also can serve to conduct one or more integrity tests of selected data, to ensure collected data is not corrupted or schedules of planned indoor scans are appropriate for collection of data for specific types of analysis. Analysis component 246 can flush data cache 636 periodically or at predetermined intervals.

Figure 7:
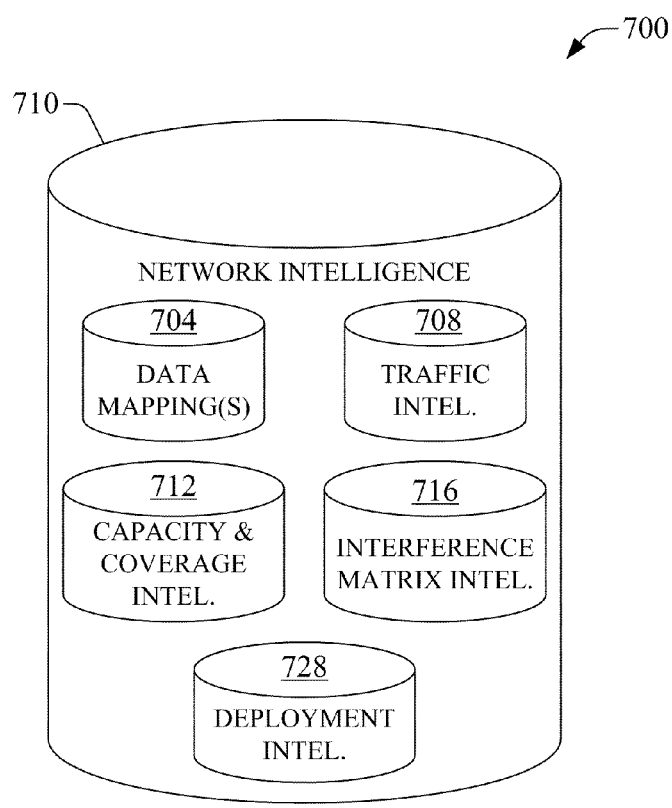
FIG. 7 displays a diagram of an example network intelligence repository in accordance with aspects described herein.

FIG. 7 displays a diagram 700 of an example network intelligence repository 710, which can be part of NetOp intelligence 632, in accordance with aspects described herein. Data mapping storage, or data mapping(s), 704 includes associations between received or aggregated data and location of an originating set of femto access points, or a set of indoor base stations. In addition, data mapping(s) 704 includes links between data and at least one of pertinent operators including the network operator that administers data collection (e.g., generate schedules and signal scan events), pertinent sector identifiers, or pertinent sector carriers. Mapping component 608 generates, at least in part, data mapping(s) 704. Traffic intelligence 708 comprises computed traffic density(ies) generated as described above. Interference matrices generated as described above are intra-operator information and can be retained in interference matrix intelligence 716.

In addition, network intelligence 710 also includes deployment intelligence 728, which can include various operation metrics in addition to those described supra, e.g., (i)-(iv) above. Deployment intelligence 728 can be extracted from aggregation of received data since disparate femto APs, or any other indoor base stations, provide data on various locations of a network deployment. Deployment intelligence 728 can include operation metrics autonomously generated through intelligent component 620. Capacity and coverage intelligence 712 comprises calculated number of unique sector indicators per operator, number of unique sector carriers per operator, site density, capacity density, or coverage density.

Figure 8:
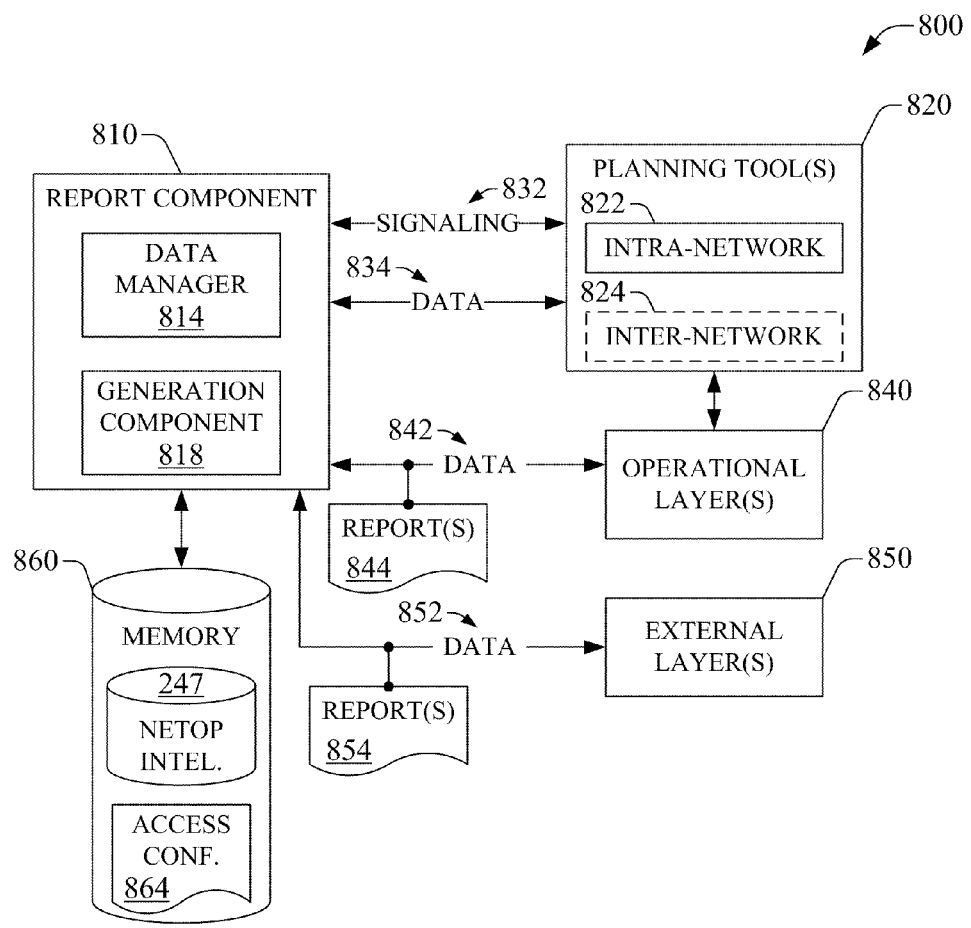
FIG. 8 illustrates a block diagram of an example system that enables network planning in accordance with aspects described herein.

FIG. 8 illustrates a block diagram of an example system 800 that enables network planning in accordance with aspects described herein. Data gathered through femto APs, or any other indoor-based base station, can provide various advantages related to network planning when employed by network planning tools. Such tools can be embodied in offline measurement acquisition programs. To exploit gathered data, a report component 810 can receive directives to deliver aggregated data retained as part of NetOp intelligence 247, or to manipulate the aggregated data, e.g., in preparation for a forthcoming data delivery. In an aspect, planning tool 820 can be functionally connected to report component 810, which is an embodiment of report component 248, via a link (e.g., a reference link; not shown), which can be embodied in a wired link(s) or a wireless link(s), and can convey such directives through signaling 832. Planning tool 820 can convey the directives periodically or based at least in part on a schedule, retained within the planning tool 820. Directives can be embodied in multi-bit words (e.g., P-bit words, with P an integer) and coded to convey specific request(s) for data or predetermined operation(s) on the stored network operation data. In addition to data retrieval, directives can instruct report component 810 to flush a portion of retained data or associated network intelligence, e.g., rolling averages related to operation metrics such as metrics (i)-(iv) above. Directives also can instruct to generate operation metrics or further aggregate available network operation data.

Report component 810, via data manager 814, can authorize or decline processing of a received directive based at least in part on an access configuration 864 that includes information on authorized sender(s) and directives. Upon authorization of a request to deliver data, data manager 814 can convey data 834 in accordance with the authorized directive. Authorization of a directive to manipulate stored data in NetOp intelligence 862, can result in data manager 814 delivering the directive to an analysis component, e.g., component 218, for at least partial processing.

Additionally, access configuration 864 can identify a set of data categories with disparate levels of access, wherein a planning tool can access portions of retained network operation data in accordance with the access category of the portion of data. Access classification can allow, at least in part, data delivery to disparate intra-network planning tools 822 and, optionally, inter-network planning tools 824. A network operator that manages a femto network (e.g., femto network and a set of deployed femto APs), or any other network of indoor-based access points, can opt to establish an access configuration 864 that can fulfill delivery requests to inter-network planning tools. As an example, such scenario can arise when a partnership is formed between the network operator and a disparate network operator.

Data manager 814 also can convey data 842 to operational layer(s) 840, which can comprise intra-network components, and can exchange information with at least a portion of planning tool(s) 820. Data 842 can afford, at least in part, functionality of operation layer(s) 840, which can include one or more of operation and maintenance server(s) or equipment; customer support server(s); administration layer(s); acquisition server(s); billing server(s); or the like. In addition, generation component 818 can produce and supply report(s) 844 associated at least in part with conveyed data 842. Similarly, data 852 and report(s) 854 can be delivered to external layer(s) 850, which can comprise inter-network operational layer(s); vendor and service platform(s) such as Enhanced 911 service and location services vendor; server(s) within regulatory entities such as the Federal Communications Commission; etc. Access configuration 864 can control at least a portion of data 852 and contents of report(s) 854. Reports such as report(s) 844 or report(s) 854 can be embodied in a SMS message, a USSD message, or one or more bits delivered through a control channel, or a header of a data packet.

Figure 9:
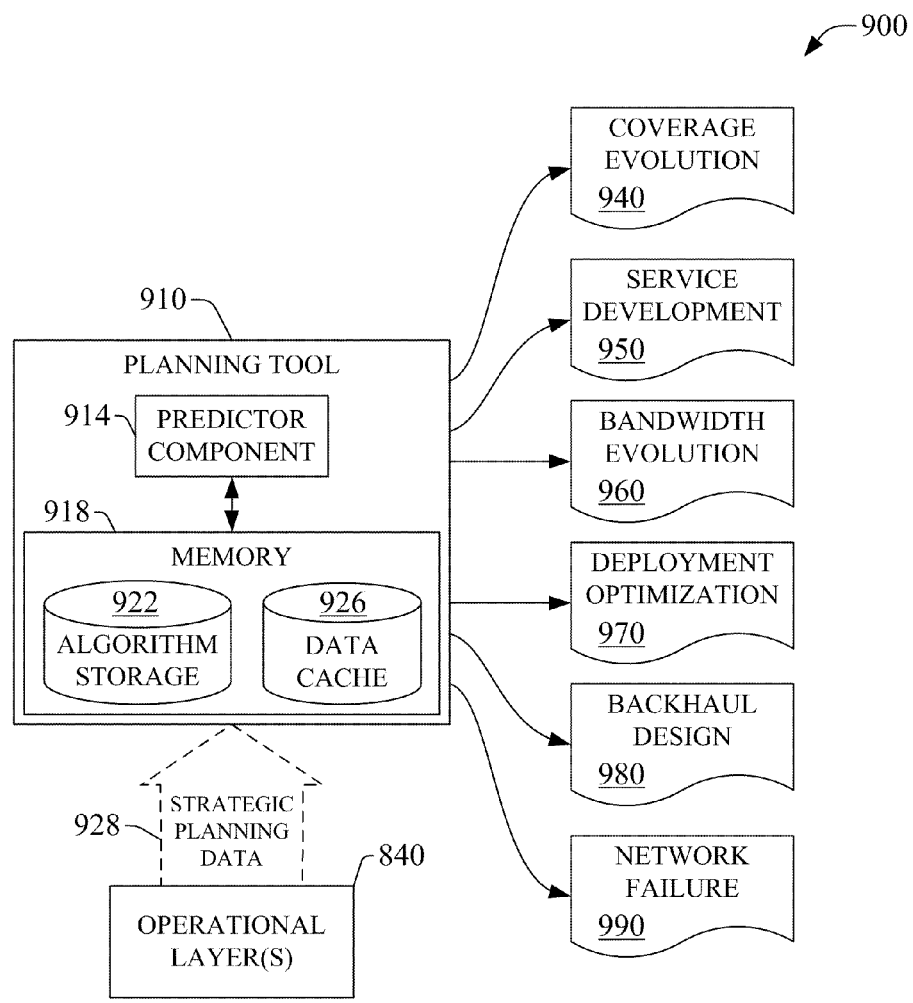
FIG. 9 illustrates a block diagram of an example system that predicts various aspects of network development in accordance with aspects described herein.

FIG. 9 illustrates a block diagram of an example system 900 that simulates various aspects of network development in accordance with aspects described herein. Planning tool 910, which can be an embodiment of planning tool(s) 260, retrieves data collected through a set of femto APs to simulate at least in part network operation and predict various aspects of coverage and capacity of one or more wireless networks. Predictions can include at least one of (a) coverage evolution 940, (b) service development 950, which can include sales planning, development of advertising and promotional campaigns, etc.; (c) bandwidth evolution 960, which includes planning of bids to license EM spectrum, and resource allocation for such bidding; (d) deployment optimization 970 such as cell sectorization and frequency planning and reuse design; (e) backhaul design 980, which includes procurement or upgrade of backhaul wireless or wired links; or (f) network failure 990, which includes identification of underperforming base stations with respect to own network base stations, or extraction of own network performance trends, spatial and temporal, to evaluate potential or forecasted failure points. Such predictions can be retained in substantially any computer-readable medium such as removable memory cards or other memory components. Predictions can be based at least in part on Monte Carlo simulations; molecular dynamics modeling of traffic development, e.g., attrition, growth; machine-learning or AI techniques, as described above; or the like. In an aspect, a predictor component 914 can perform the simulations and modeling, and carry out various learning associated with retrieved data. To at least that end, predictor component can utilize algorithm storage 922 and data cache 926, which reside in memory 918 and can retain at least a portion of the retrieved data. It is noted that algorithm(s) exploited by predictor component 914 can be retained in substantially any component, or memory therein or functionally coupled thereto, in non-mobile network that hosts planning tool 910.

Planning tool 910 can complement or supplement simulation and modeling, and learning instances, with strategic planning data 928 received from one or more operation layer(s) 930. Strategic planning data can include one or more of network upgrades such as new deployments of coverage macro cells or sectors; addition of new technology layers (e.g., infrastructure and application(s) associated with a technology); reconfiguration of radio resource(s) reuse; product(s) or service(s) launch planned date(s); subscriber intelligence; service intelligence; EM spectrum bidding strategy or plan(s), either actual or hypothetical; radio technology development; marketplace development such expansion of services to new markets, or generation of business partnerships; or the like.

One or more processors (not shown) are configured to confer, and confer, at least in part, the described functionality of planning component 910 and component(s) therein. The one or more processors (not shown) can be functionally coupled to and can execute code instructions (not shown) stored in a memory (not shown), or a memory component therein, to provide the described functionality of planning component 910.

In view of the example systems described above, example methods that can be implemented in accordance with the disclosed subject matter can be better appreciated with reference to flowcharts in FIGS. 10-17. For purposes of simplicity of explanation, example methods disclosed herein are presented and described as a series of acts; however, it is to be understood and appreciated that the claimed subject matter is not limited by the order of acts, as some acts may occur in different orders and/or concurrently with other acts from that shown and described herein. For example, one or more example methods disclosed herein could alternatively be represented as a series of interrelated states or events, such as in a state diagram. Moreover, interaction diagram(s) may represent methods in accordance with the disclosed subject matter when disparate entities enact disparate portions of the methodologies. Furthermore, not all illustrated acts may be required to implement a described example method in accordance with the subject specification. Further yet, two or more of the disclosed example methods can be implemented in combination with each other, to accomplish one or more features or advantages herein described. It should be further appreciated that the example methods disclosed throughout the subject specification are capable of being stored on an article of manufacture to facilitate transporting and transferring such methodologies to computers for execution, and thus implementation, by a processor or for storage in a memory.

Figure 10:
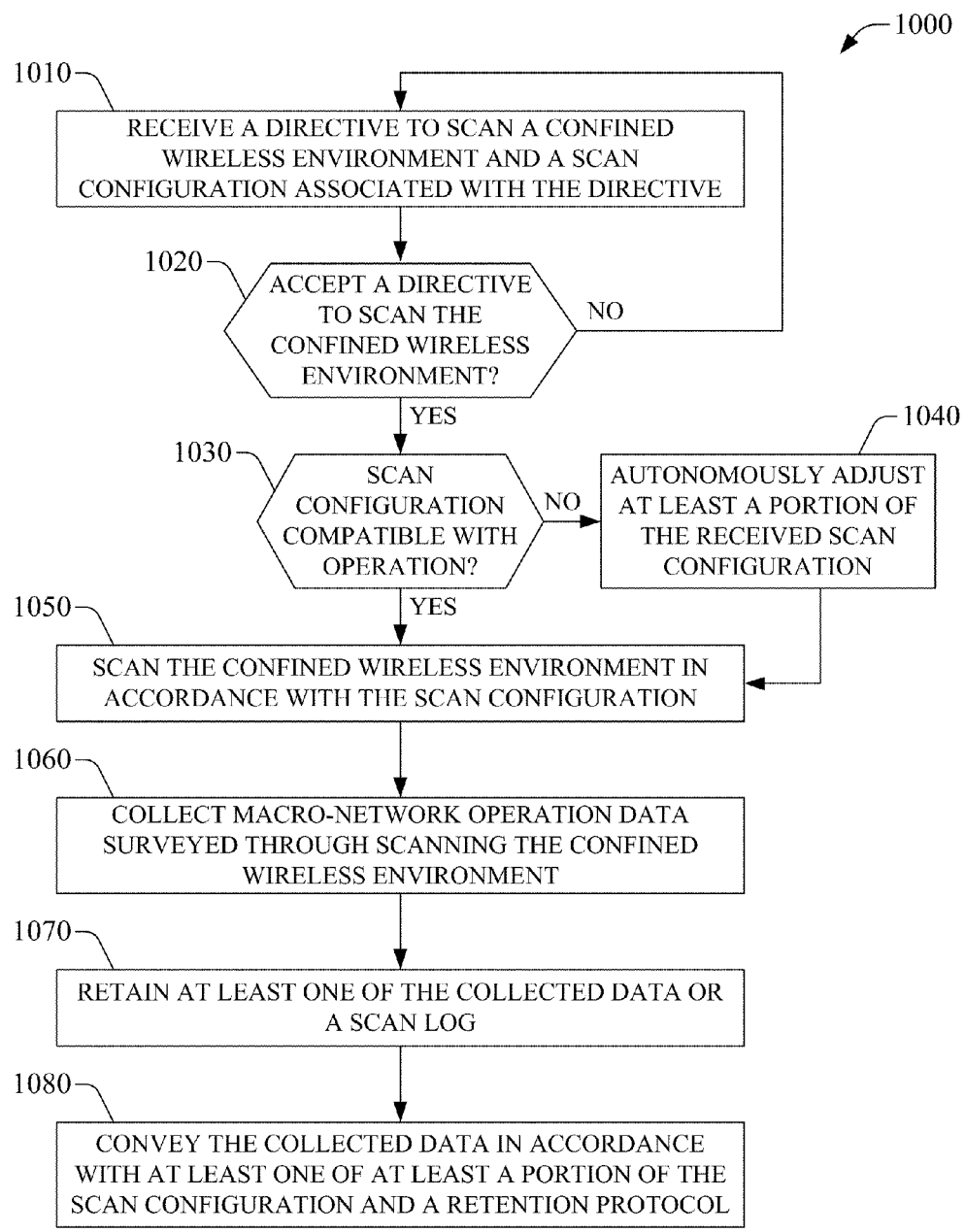
FIG. 10 depicts a flowchart of an example method for gathering operational data of a wireless macro network through an indoor-based according to aspects described herein.

FIG. 10 presents a flowchart of an example method 1000 for gathering operational data of a wireless macro network through an indoor-based according to aspects described herein. A femto access point can implement the subject example method 1000. In an aspect, at least one processor that confers, at least in part, functionality to the femto AP can enact the subject example method 1000. Alternative, or in addition, a server(s) within a femto AP can enact the subject example method 1000. Alternatively or additionally, the subject example method 1000 can be enacted at least in part by a processor that resides within the server(s) that provides functionality to the femto AP, or provides at least part of functionality of one or more components within the femto AP. At act 1010, a directive to scan the confined wireless environment and a scan configuration associated with the directive are received. In an aspect, a directive can be received from one or more gateway node(s) in a femto network platform (see FIG. 2). At act 1020, it is probed if the directive to scan the confined wireless environment is accepted. In the negative case, flow is redirected to 1010 as part of, for example, a retry cycle. Conversely, flow is directed to act 1030, in which it is probed whether the scan configuration is compatible with operation of the femto AP that serves the confined wireless environment and enacts the subject example method. In the affirmative case, flow is directed to act 1050. Conversely, in the negative case, at least a portion of the received scan configuration is autonomously adjusted at act 1040. At act 1050, a confined wireless environment is scanned in accordance with the scan configuration associated with the directive to scan the confined wireless environment. In an aspect, scanning can be effected by a scanner component (e.g., component(s) 212) within the femto AP that enacts the subject method. The scan configuration can include at least one of a scan profile, a privacy profile, or a schedule (see FIGS. 2-3 and associated description); and the confined environment can be a home-based or an enterprise-based environment. The scan profile can determine at least in part a set of measurements to be performed as part of the scan of the confined wireless environment. Measurements can include Schedule and measurements determined in the scan profile can be related, with specific measurements taken at specific time instants as defined in the schedule. The scan configuration can be received at predetermined intervals, periodic or otherwise, or upon occurrence of specific operational events such as provisioning of the femto AP that enacts the subject method, or reconfiguration of such femto AP. The scan configuration can be received from a mobile network platform (e.g., femto network, macro network, Wi-Fi network . . . ) component, such as a server or gateway node; and it can be received through a broadband backhaul backbone (e.g., backhaul link 153).

At act 1060, macro-network operation data surveyed through scanning the confined wireless environment is collected. Collecting macro-network operation data includes decoding measurements of signal(s) taken on at least one of a set of radio technologies and a set of EM frequency bands specified in at least a portion of the scan configuration. Signal (s) can include at least one of pilot signal(s) and system broadcast message(s), and traffic signal(s). Frequency bands can include all EM frequency bands licensed by a network operator that manages a femtocell network that includes the femto APs that conduct the scans; all EM frequency bands licensed to competing networks; and all unlicensed EM frequency bands. In addition, collecting macro-network operation data includes decoding time-of-flight (TOF) measurements, e.g., measurements of round trip time (RTT), or measurement of time difference of arrival (TDOA), performed to supplement measurements determined in a scan profile. Collected data can originate from a network conducting the scan (or implementing the subject example method) or a competing network (e.g., a non-owned network). At act 1070, at least one of the collected data or a scan log is retained. Retaining collected data can include A scan log can be generated subsequent to data collection and can allow, at least in part, to perform data analysis or organize historical data. Data or the scan log, or both, can be stored within a memory (e.g., memory 222) internal to the femto AP the enacts the subject method, or an offline memory that is external to the femto AP or a femto network platform associated therewith and is functionally coupled to the femto AP. As an example, an offline memory can be a memory within a server within the confined wireless environment, which is served through the femto AP. At act 1080, at least one of the collected data or the scan log is conveyed in accordance with at least one of at least a portion of the scan configuration and a retention protocol. In an aspect, received signaling can indicate, e.g., through a schedule or an asynchronous request, to supply at least a portion of the collected data. An indication can be embodied for example in a SMS communication, a USSD message, or a set of bits delivered in a control channel. In another aspect, the retention protocol can include a schedule to deliver the collected data; the schedule can be generated autonomously by the femto AP that enacts the subject example method. Such generating of a delivery schedule can be based at least in part on historical traffic patterns at the femto AP. The retention protocol also can establish management of conveyed data, such as period(s) of time during which conveyed data is retained prior to the data being flushed, or compressed and stored as backup information. Data originating from disparate measurements can be retained for disparate terms.

Figure 11:
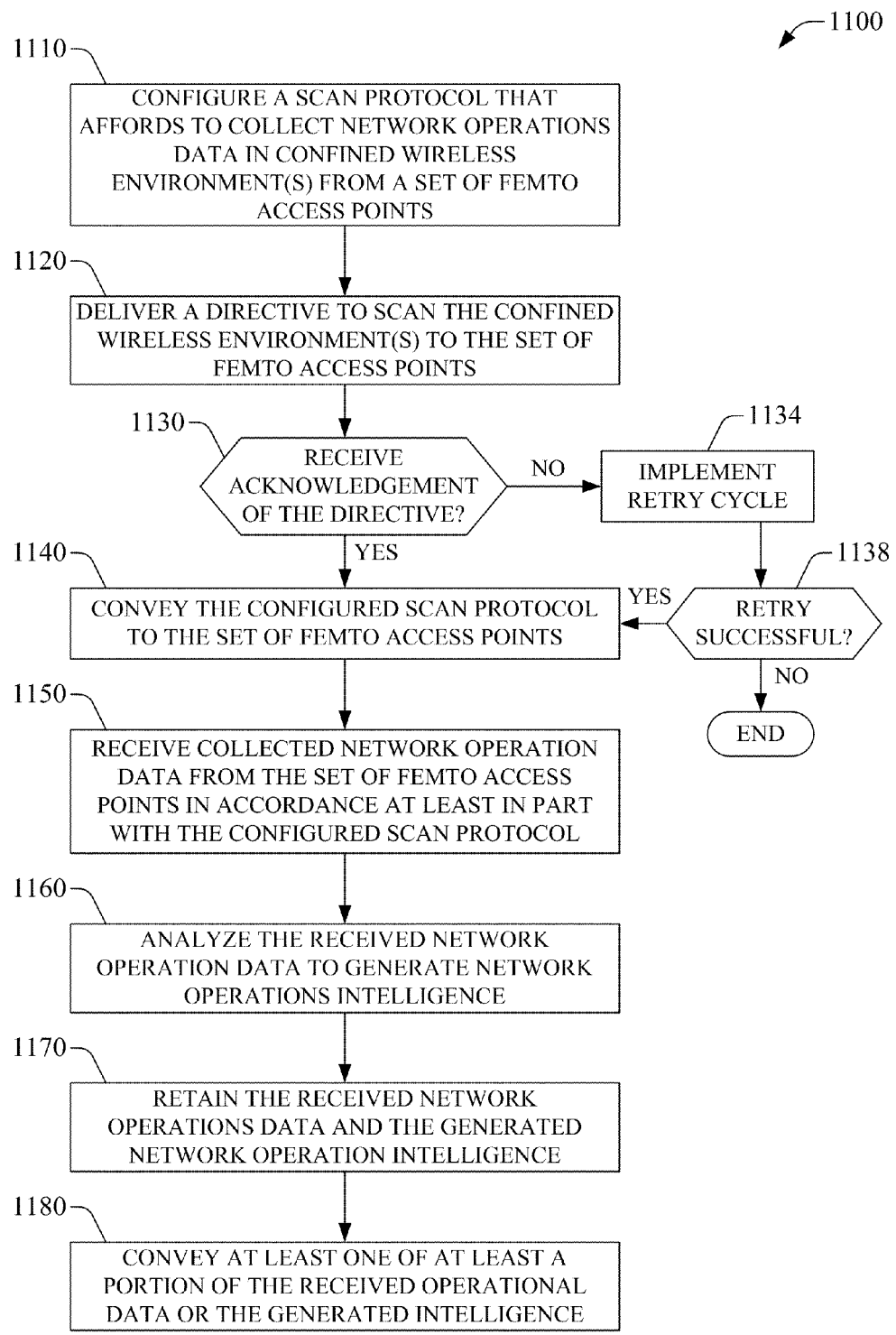
FIG. 11 depicts a flowchart of an example method for administering indoor collection of network operation data associated with macro wireless coverage according to aspects disclosed herein.

FIG. 11 depicts a flowchart of an example method 1100 for administering indoor collection of network operation data associated with macro wireless coverage according to aspects disclosed herein. One or more network components (e.g., server(s) 250) can implement the subject example method 1100. Additionally or alternatively, at least one processor that confers, at least in part, functionality to the one or more network components can enact the subject example method 1100. At act 1110, a scan protocol or configuration that affords to collect network operation data on confined wireless environment(s) from a set of femto access points (APs) is configured. It is noted that the scan protocol can be configured to collect data from most any or any indoor access point (e.g., Wi-Fi access point, picocell AP . . . ). Configuration includes establishing a set of measurements to be performed as part of the scan. The network operation data originates from a set of one or more network operators that provide wireless macro coverage. At act 1120, a directive to scan the confined wireless environment(s) is delivered. At act 1130, it is probed if acknowledgement of the directive is received. In the negative case, a retry cycle is implemented at act 1134, while at act 1138 it is probed if the retry cycle is successful, e.g., an acknowledgment is received. When an acknowledgment to the directive is received, flow is directed to act 1140, in which the configured scan profile is conveyed to the set of femto access points. At act 1150, collected network operation data is received from the set of femto APs in accordance at least in part with the configured scan profile. At act 1160, the received network operation data is analyzed to generate network operations (NetOps) intelligence. Such intelligence can be categorized at least in art according to at least one of network operator or network operation aspects.

At 1170, at least one of the received network operation data and the generated network operations intelligence is retained. Data can be stored within a memory element (e.g., NetOp intelligence 442) in a memory (e.g., 1486) internal or external to a femto network platform (see FIG. 1) that operates at least in part the one or more network components that can enact the subject example method. As an example, an external memory can be a memory within a server in the femto network platform, or in a memory platform in external network(s) (e.g., IP multimedia subsystem, network operations center local are network . . . ) operationally coupled to the femto network platform. At 1180, at least one of the at least one portion of the received operational data or the generated intelligence is conveyed. In an aspect, data or intelligence is conveyed to a planning tool managed by the service operator that collects the data, or a planning tool administered by an entity external to such service operator. In another aspect, data or intelligence can be conveyed to one or more operational layer(s) associated (e.g., financially, commercially, or strategically) with the service provider operator. In yet another aspect, data or intelligence can be delivered to external layer(s) such as real estate agents that have access to space(s) suitable for cell site deployment, technical service vendors, or the like.

Figure 12:
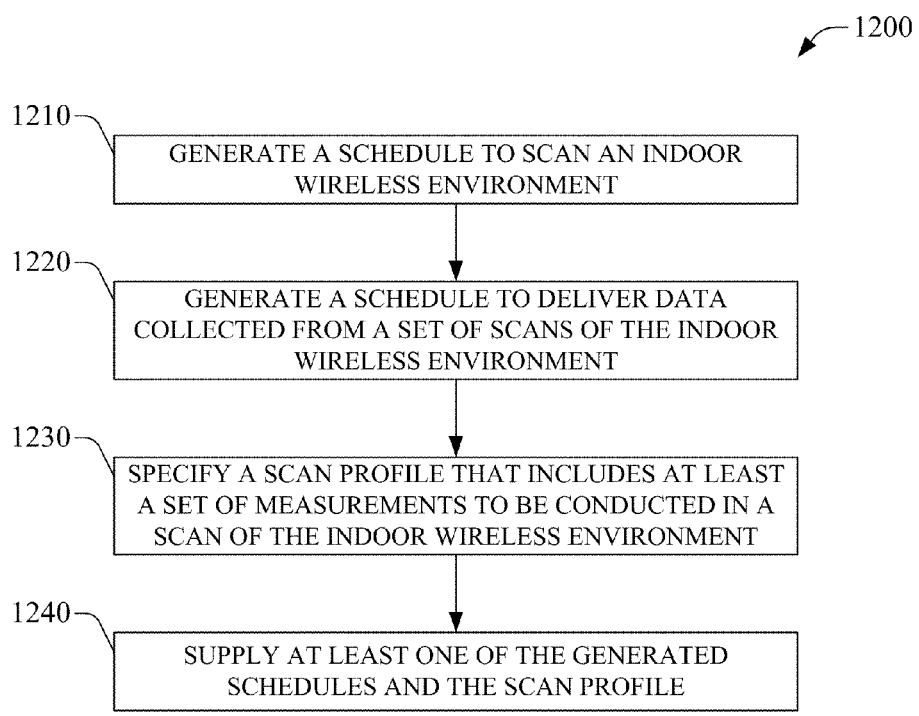
FIG. 12 displays a flowchart of an example method for configuring a scan profile that affords to collect network operation data on confined wireless environment(s) according to aspects described in the subject specification.

FIG. 12 displays a flowchart of an example method 1200 for configuring a scan protocol that affords to collect network operation data on confined wireless environment(s) according to aspects described in the subject specification. One or more network components (e.g., server(s) 250) can implement the subject example method 1200. Additionally or alternatively, at least one processor that confers, at least in part, functionality to the one or more network components can enact the subject example method 1200. At act 1210, a schedule to scan an indoor wireless environment is generated. The schedule can specify a set of times at which a predetermined measurement of wireless signal(s) (e.g., pilot signal, system messages) is to be conducted. In an aspect, in situations when scanning requires shutdown of the transmitter of a home-based AP that is to perform the wireless indoor scan, the schedule can include one or more times that substantially coincide, or coincide, with times for which historically operational data of the home-based AP indicate that there are no attached customers or served traffic on home-based AP. At act 1220, a schedule to deliver data collected form a set of scans of the indoor wireless environment is generated. At act 1230, a scan profile that includes at least a set of measurements to be conducted in a scan of the indoor wireless environment is specified. At act 1240, at least one of the generated schedules and the scan profile is supplied. In an aspect, the generated schedules and the scan profile is supplied to a component that can deliver the schedules and scan profile to a set of one or femto access points. It should be appreciated that other indoor-based HAPs can be exploited.

Figure 13:
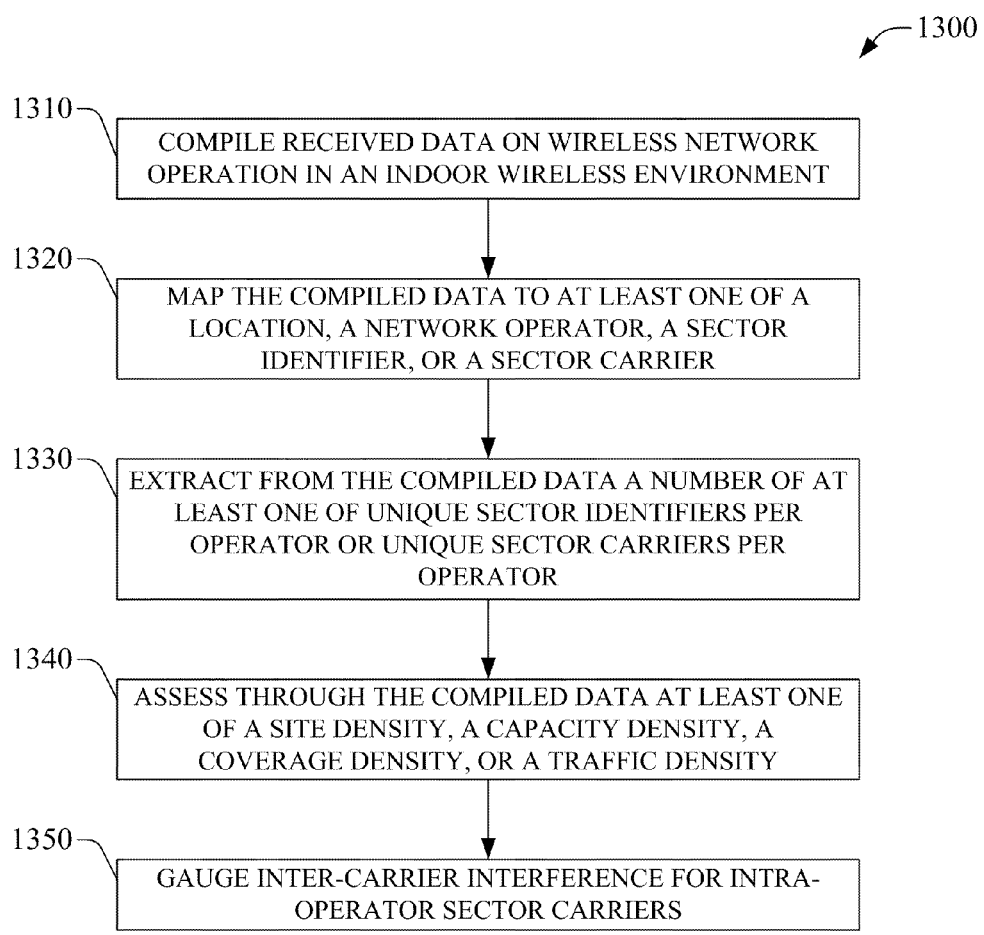
FIG. 13 displays a flowchart of an example method for analyzing network operation data gathered in an indoor confined wireless environment according to aspects described in the subject specification.

FIG. 13 displays a flowchart of an example method 1300 for analyzing network operation data gathered in an indoor confined wireless environment according to aspects described in the subject specification. One or more network components (e.g., server(s) 250) can implement the subject example method 1300. Additionally or alternatively, at least one processor that confers, at least in part, functionality to the one or more network components can enact the subject example method 1300. At act 1310, received data on wireless network operation is compiled. In an aspect, the data originates from macro network wireless coverage, and is received from a set of home-based access points (e.g., femtocell APs). As an example, aggregation component 604 can carry out the data compilation. At act 1320, the compiled data is mapped to at least one of a location, a network operator, a sector identifier, or a sector carrier. Mapping received network operation data to a location can include identifying an indoor AP that is the source of the data and retrieving location information—e.g., geocode; ZIP code; longitude; latitude and altitude—for the indoor AP from a subscriber database (e.g., home subscriber server) or an external location intelligence repository. It should be appreciated that location of an indoor AP can be collected, for example, at the time of provisioning the indoor AP for service. In addition, mapping to a location can include aggregating GPS time-stamped information to locate and record competitor networks' unique transmission locations; e.g., generate a distance roster, or registry, or location hypotheses for competing operator base stations. At act 1330, a number of at least one of unique sector identifiers per operator or unique sector carriers per operator is extracted from the compiled data. At act 1340, at least one of a site density, a capacity density, a coverage density, or a traffic density is assessed through the compiled data. Site density is the number of unique sector identifiers per network operator. Capacity density is the number of unique sector carriers per operator normalized by the carrier's bandwidth. Coverage density is defined as the average signal strength per operator. Traffic density is UL noise per unique mobile device detected in a predetermined, configurable time interval. At act 1350, inter-carrier interference for intra-operator sector carriers is gauged. In an aspect, gauging includes at least constructing an interference matrix.

Figure 14:
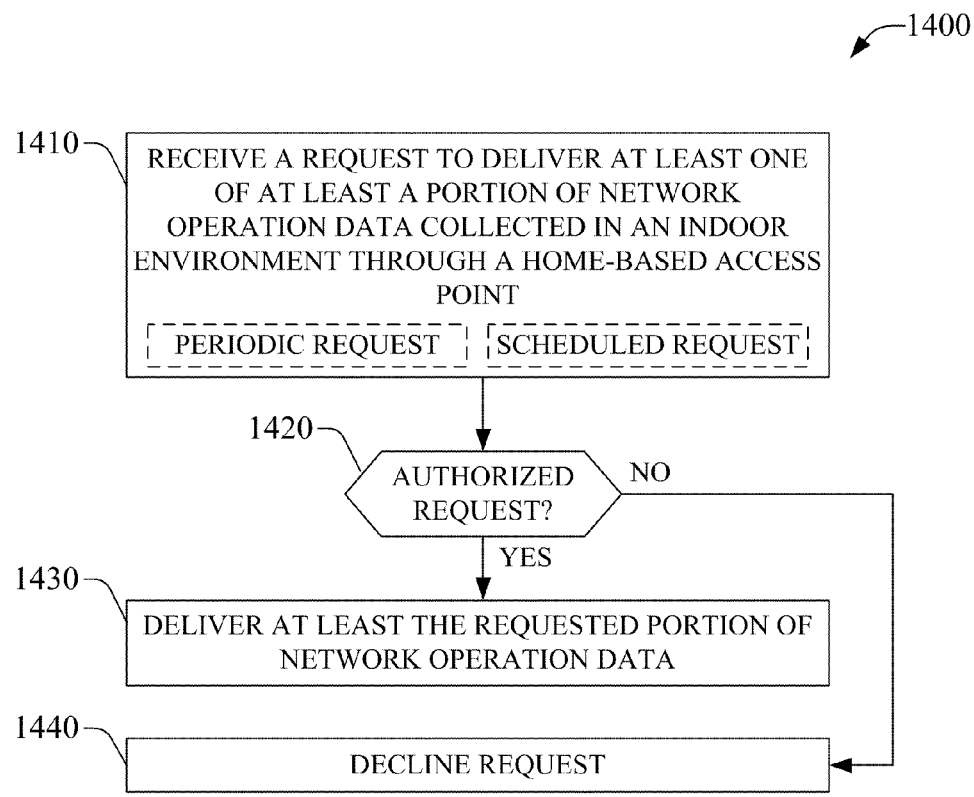
FIG. 14 illustrates a flowchart of an example method for releasing network operation data according to aspects described herein.

FIG. 14 illustrates a flowchart of an example method 1400 for manipulating network operation data according to aspects described herein. One or more network components (e.g., server(s) 250) can implement the subject example method 1400. Additionally or alternatively, at least one processor that confers, at least in part, functionality to the one or more network components can enact the subject example method 1400. At act 1410, a request to deliver at least a portion of network operation data collected in an indoor environment through a home-based AP is received. In addition the request can demand at least a portion of network intelligence generated from the network operation data. The request can be received periodically or based at least in part on a scheduled. As indicated supra, it is noted that other indoor-based APs, e.g., enterprise-based AP, can collect the network operation data. At act 1420, a determination is made whether the received request is an authorized request. In the affirmative case, at least the requested portion of network operation data is delivered at act 1430. Conversely, in the negative case, at act 1440, the request is declined. In an aspect, declining a request can include delivering an error message to the request source. Additionally or alternatively, declining the received request can include retaining information on the request source to allow, at least in part, data integrity. For instance, if recurrent requests are declined from the same source, the request may be malicious or issues may exist with one or more access components that regulate access to network operation data repository(ies).

Figure 15:
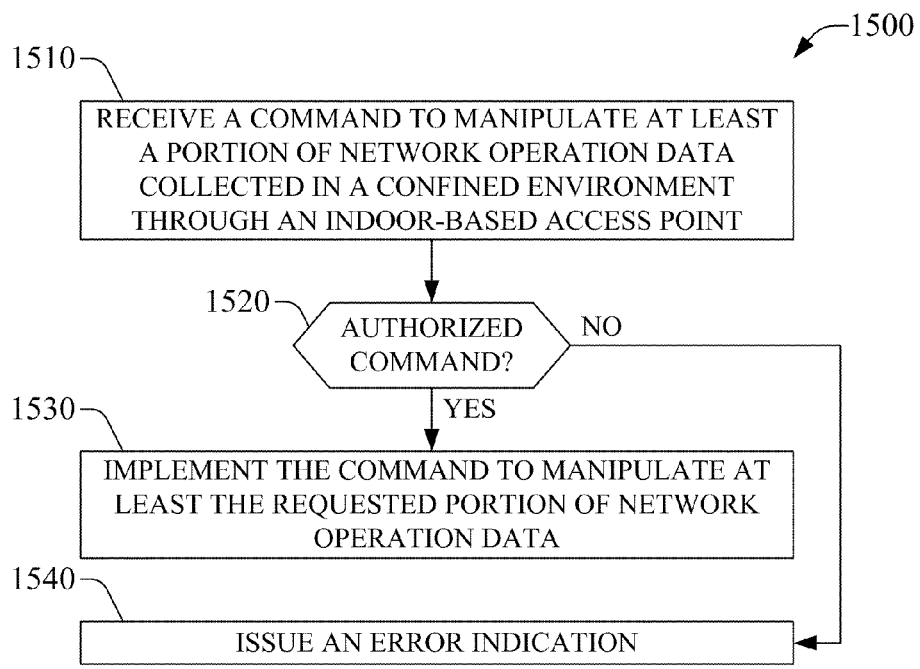
FIG. 15 illustrates a flowchart of an example method for manipulating network operation data according to aspects described herein.

FIG. 15 illustrates a flowchart of an example method for manipulating network operation data according to aspects described herein. One or more network components (e.g., server(s) 250) can implement the subject example method 1500. Additionally or alternatively, at least one processor that confers, at least in part, functionality to the one or more network components can enact the subject example method 1500. At act 1510, a command to manipulate at least a portion of network operation data collected in a confined environment through an indoor-based access point is received. At act 1520, it is determined whether the received command is an authorized command. In the affirmative case, at act 1530, the command to manipulate at least a portion of the network operation data is implemented. Conversely, in the negative case, an error indication is issued at act 1540.

Figure 16:
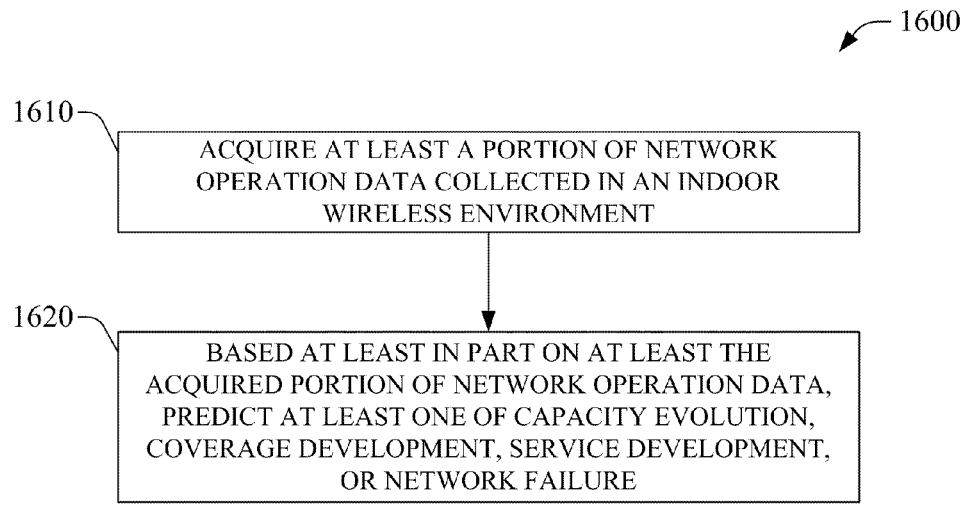
FIG. 16 is a flowchart of an example method for generating network planning information according to aspects described herein.

FIG. 16 is a flowchart of an example method 1600 for generating network planning information according to aspects described herein. One or more network components can implement the subject example method 1600. Additionally or alternatively, at least one processor that confers, at least in part, functionality to the one or more network components can enact the subject example method 1600. At act 1610, at least one of a portion of network operation data or a portion of network intelligence generated at least in part within an indoor wireless environment is acquired. At act 1620, based at least in part on the at least the acquired portion of network operation data or network intelligence, for one or more networks, at least one of capacity evolution, coverage development, service development, or network failure is predicted. Service development can include sales planning, development of advertising and promotional campaigns, etc.

Figure 17:
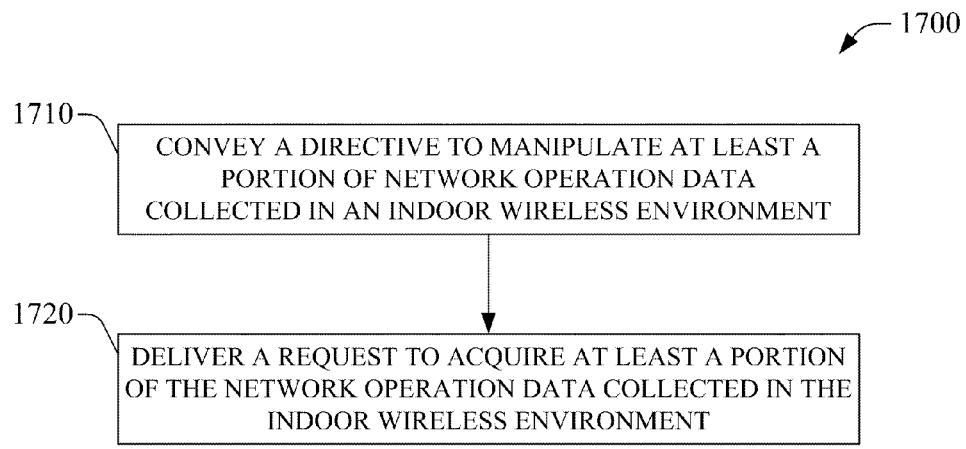
FIG. 17 illustrates a flowchart of an example method for accessing network operation data according to aspects described herein.

FIG. 17 illustrates a flowchart of an example method 1700 for accessing network operation data according to aspects described herein. One or more network components can implement the subject example method 1700. Additionally or alternatively, at least one processor that confers, at least in part, functionality to the one or more network components can enact the subject example method 1700. At act 1710, a directive to manipulate at least a portion of network operation data collected in an indoor wireless environment is conveyed. At act 1720, a request to acquire at least a portion of the network operation data collected in the indoor wireless environment is delivered.

Figure 18:
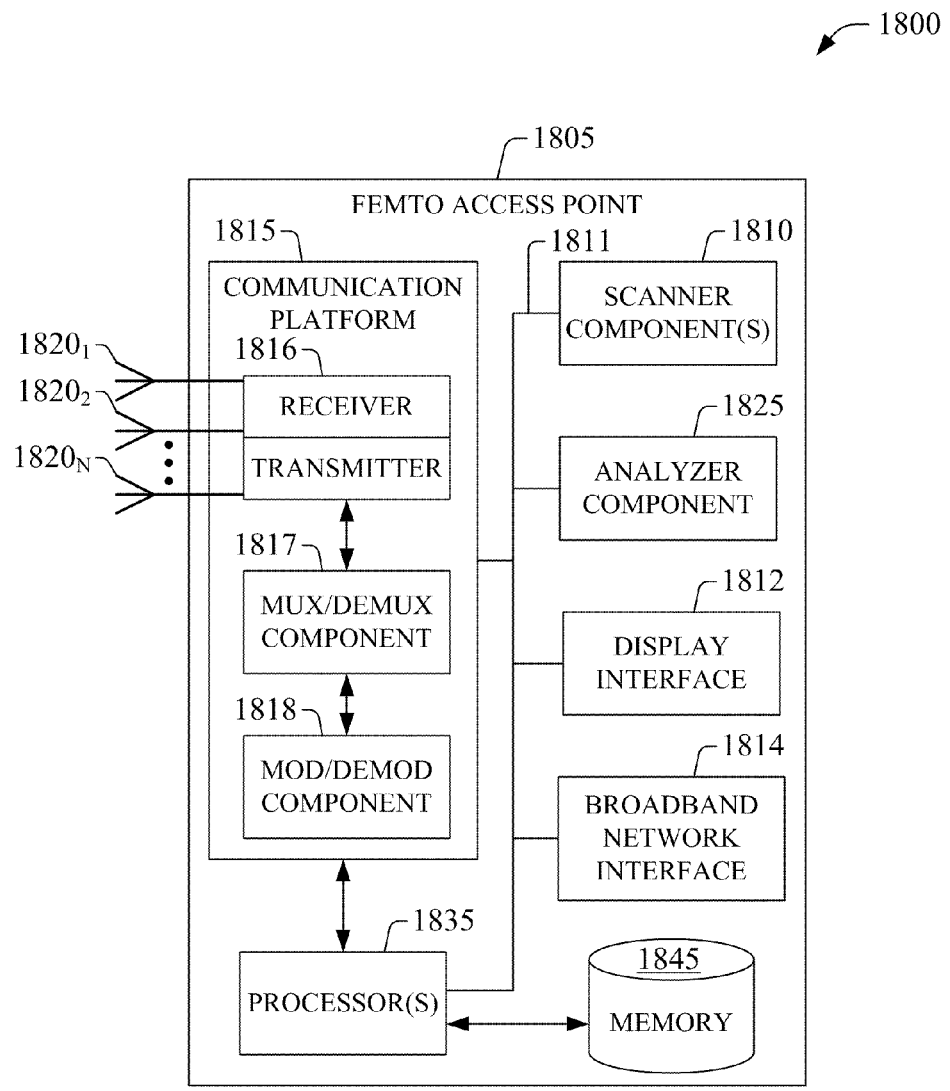
FIG. 18 illustrates a block diagram of an example embodiment of a femto access point that can enable or exploit features or aspects of the subject innovation.
Figure 19:
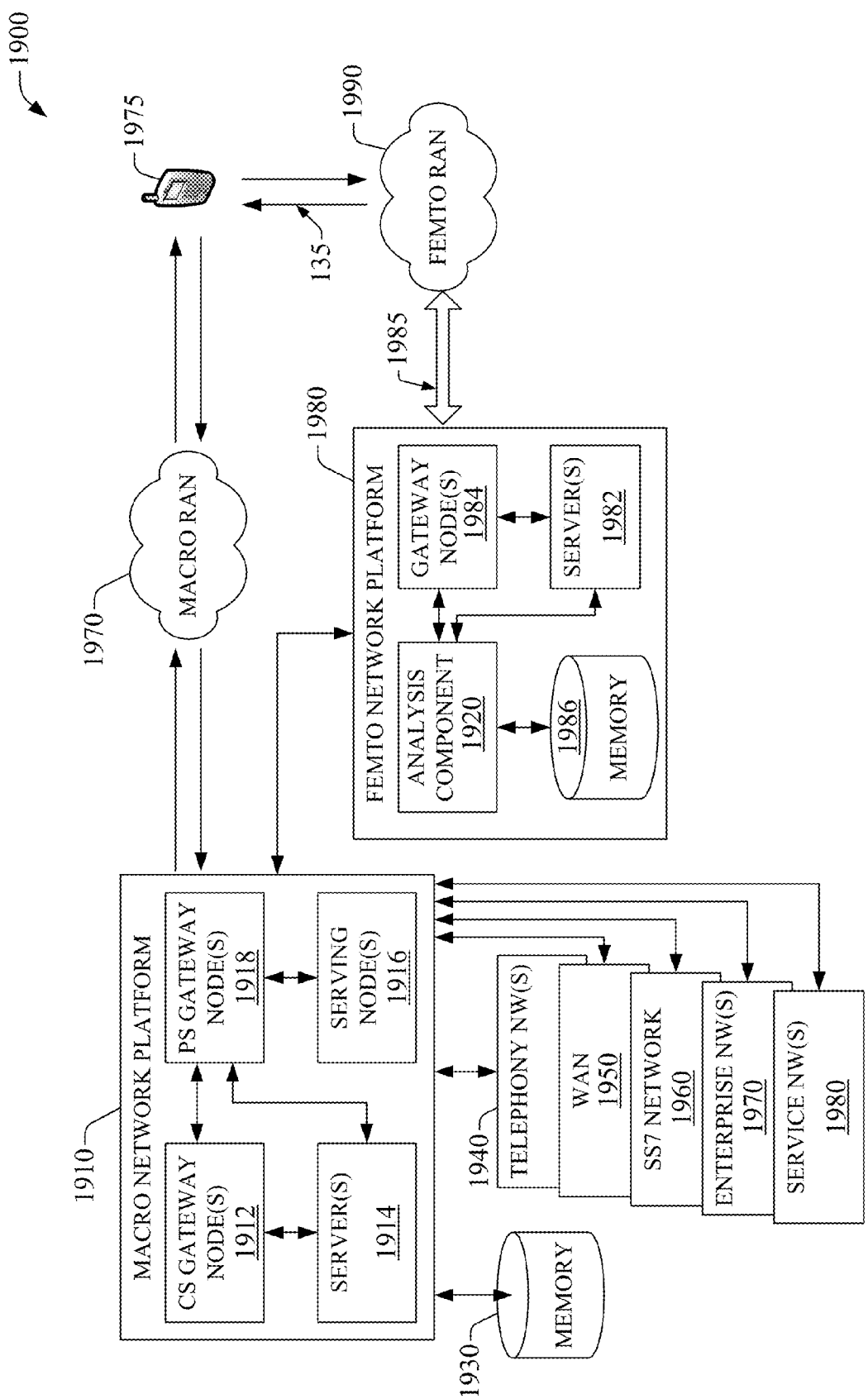
FIG. 19 is an example wireless network environment that can enable aspects or features of a femto network platform in accordance with various aspects of the subject specification.

To provide further context for various aspects of the subject specification, FIG. 18 and FIG. 19 illustrate, respectively, a block diagram of an example embodiment 1800 of a femtocell access point that can enable or exploit features or aspects of the subject innovation, and example wireless network environment 1900 that includes femto and macro and that can enable aspects or feature of a mobile network platform as described herein, and utilize femto APs that exploit aspects of the subject innovation in accordance with various aspects of the subject specification.

In embodiment 1800, femto AP 1805 can receive and transmit signal(s) (e.g., signaling 235 or 266) from and to wireless devices like femto access points, access terminals, wireless ports and routers, or the like, through a set of antennas $1820_1$-$1820_N$ (N is a positive integer). It should be appreciated that antennas $1820_1$-$1820_N$ embody antenna(s) component 217, and are a part of communication platform 1815, which comprises electronic components and associated circuitry that provides for processing and manipulation of received signal(s) and signal(s) to be transmitted. Such electronic components and circuitry embody at least in part signaling detection component 219; communication platform 1815 operates in substantially the same manner as communication platform 214 described hereinbefore. The electronic components and circuitry can include a set of one or more chipsets that enable decoding, or deciphering signal(s) conveyed in various disparate radio technologies. In an aspect, communication platform 1815 can decode GPS signaling such as timing messages.

In an aspect, communication platform 1815 includes a receiver/transmitter 1816 that can convert signal from analog to digital upon reception, and from digital to analog upon transmission. In addition, receiver/transmitter 1816 can divide a single data stream into multiple, parallel data streams, or perform the reciprocal operation. Coupled to receiver/transmitter 1816 is a multiplexer/demultiplexer 1817 that facilitates manipulation of signal in time and frequency space. Electronic component 1817 can multiplex information (data/traffic and control/signaling) according to various multiplexing schemes such as time division multiplexing (TDM), frequency division multiplexing (FDM), orthogonal frequency division multiplexing (OFDM), code division multiplexing (CDM), space division multiplexing (SDM). In addition, mux/demux component 1817 can scramble and spread information (e.g., codes) according to substantially any code known in the art; e.g., Hadamard-Walsh codes, Baker codes, Kasami codes, polyphase codes, and so on. A modulator/demodulator 1818 is also a part of communication platform 1815, and can modulate information according to multiple modulation techniques, such as frequency modulation, amplitude modulation (e.g., M-ary quadrature amplitude modulation (QAM), with M a positive integer), phase-shift keying (PSK), and the like Femto access point 1805 also includes a processor 1835 configured to confer, and confer, at least in part, functionality to substantially any electronic component in femto AP 1805. In particular, processor 1835 can facilitate configuration of femto AP 1805, via configuration component (not shown), and one or more components therein, which can have radio network controller functionality. Additionally, processor 1835 can facilitate scanning of a macro wireless environment through scanner component(s) 1810 in accordance to various aspects described herein in connection with scanner component(s) 212 and related component(s) or embodiments.

Additionally, femto AP 1805 includes display interface 1812, which can display functions that control functionality of femto AP 1805, or reveal operation conditions thereof. In addition, display interface 1812 can include a screen to convey information to an end user. In an aspect, display interface 1812 can be a liquid crystal display (LCD), a plasma panel, a monolithic thin-film based electrochromic display, and so on. Moreover, display interface can also include a component (e.g., speaker(s)) that facilitates communication of aural indicia, which can also be employed in connection with messages that convey operational instructions to an end user. Display interface 1812 also facilitates data entry (e.g., through a linked keypad or via touch gestures), which can facilitated femto AP 1805 to receive external commands (e.g., restart operation).

Broadband network interface facilitates connection of femto AP 1805 to femto network via backhaul link(s) 153 (not shown in FIG. 18), which enables incoming and outgoing data flow. Broadband network interface 1814 can be internal or external to femto AP 1805, and it can utilize display interface 1812 for end-user interaction and status information delivery.

Processor 1835 also is functionally connected to communication platform 1815 and can facilitate operations on data (e.g., symbols, bits, or chips) for multiplexing/demultiplexing, such as effecting direct and inverse fast Fourier transforms, selection of modulation rates, selection of data packet formats, inter-packet times, etc. Moreover, processor 1835 is functionally connected, via data, system, or address bus 1811, to display interface 1812 and broadband network interface 1814 to confer, at least in part functionality to each of such components.

Memory 1845 also can store data structures, code instructions and program modules, or substantially any type of software or firmware; system or device information; code sequences hypotheses, and modulation and multiplexing hypotheses; spreading and pilot transmission; femto AP floor plan configuration; and so on. Furthermore, memory 1845 also can retain content(s) (e.g., multimedia files, subscriber-generated data); security credentials (e.g., passwords, encryption keys, digital certificates, biometric reference indicators like voice recordings, iris patterns, fingerprints); or the like.

Processor 1835 is coupled, e.g., via a memory bus, to the memory 1845 in order to store and retrieve information necessary to operate and/or confer functionality to the components, platform, and interface that reside within femto access point 1805.

With respect to FIG. 19, wireless communication environment 1900 includes two wireless network platforms: (i) A macro network platform 1910 which serves, or facilitates communication with user equipment 1975 (e.g., mobile $120_A$) via a macro radio access network (RAN) 1970. It should be appreciated that in cellular wireless technologies (e.g., 3GPP UMTS, HSPA, 3GPP LTE, 3GPP UMTS, 3GPP2 UMB), macro network platform 1910 is embodied in a Core Network. (ii) A femto network platform 1980, which can provide communication with mobile 1975 through a femto RAN 1990, which is linked to the femto network platform 1980 via backhaul pipe(s) 1985 (e.g., backhaul link(s) 153). It should be appreciated that macro network platform 1910 typically hands off UE 1975 to femto network platform 1910 once UE 1975 attaches (e.g., through macro-to-femto handover) to femto RAN 1990, which includes a set of deployed femto APs (e.g., femto AP 130) that can operate in accordance with aspects described herein.

It is noted that RAN includes base station(s), or access point(s), and its associated electronic circuitry and deployment site(s), in addition to a wireless radio link operated in accordance with the base station(s). Accordingly, macro RAN 1970 can comprise various coverage cells like cell 105, while femto RAN 1990 can comprise multiple femtocell access points such as femto AP 130. Deployment density in femto RAN 1990 is substantially higher than in macro RAN 1970.

Generally, both macro and femto network platforms 1910 and 1980 include components, e.g., nodes, gateways, interfaces, servers, or platforms, that facilitate both packet-switched (PS) (e.g., internet protocol (IP), frame relay, asynchronous transfer mode (ATM)) and circuit-switched (CS) traffic (e.g., voice and data) and control generation for networked wireless communication. In an aspect of the subject innovation, macro network platform 1910 includes CS gateway node(s) 1912 which can interface CS traffic received from legacy networks like telephony network(s) 1940 (e.g., public switched telephone network (PSTN), or public land mobile network (PLMN)) or a SS7 (signaling system #7) network 1960. Circuit switched gateway 1912 can authorize and authenticate traffic (e.g., voice) arising from such networks. Additionally, CS gateway 1912 can access mobility, or roaming, data generated through SS7 network 1960; for instance, mobility data stored in a VLR, which can reside in memory 1930. Moreover, CS gateway node(s) 1912 interfaces CS-based traffic and signaling and gateway node(s) 1918. As an example, in a 3GPP UMTS network, PS gateway node(s) 1918 can be embodied in gateway GPRS support node(s) (GGSN).

In addition to receiving and processing CS-switched traffic and signaling, PS gateway node(s) 1918 can authorize and authenticate PS-based data sessions with served (e.g., through macro RAN) wireless devices. Data sessions can include traffic exchange with networks external to the macro network platform 1910, like wide area network(s) (WANs) 1950, enterprise networks (NW(s)) 1970 (e.g., enhanced 911), or service NW(s) 1980 like IP multimedia subsystem (IMS); it should be appreciated that local area network(s) (LANs), which may be a part of enterprise NW(s), can also be interfaced with macro network platform 1910 through PS gateway node(s) 1918. Packet-switched gateway node(s) 1918 generates packet data contexts when a data session is established. To that end, in an aspect, PS gateway node(s) 1918 can include a tunnel interface (e.g., tunnel termination gateway (TTG) in 3GPP UMTS network(s); not shown) which can facilitate packetized communication with disparate wireless network(s), such as Wi-Fi networks. It should be further appreciated that the packetized communication can include multiple flows that can be generated through server(s) 1914. It is to be noted that in 3GPP UMTS network(s), PS gateway node(s) 1918 (e.g., GGSN) and tunnel interface (e.g., TTG) comprise a packet data gateway (PDG).

Macro network platform 1910 also includes serving node (s) 1916 that convey the various packetized flows of information, or data streams, received through PS gateway node(s) 1918. As an example, in a 3GPP UMTS network, serving node(s) can be embodied in serving GPRS support node(s) (SGSN).

As indicated above, server(s) 1914 in macro network platform 1910 can execute numerous applications (e.g., location services, online gaming, wireless banking, wireless device management . . . ) that generate multiple disparate packetized data streams or flows, and manage (e.g., schedule, queue, format . . . ) such flows. Such application(s), for example can include add-on features to standard services provided by macro network platform 1910. Data streams can be conveyed to PS gateway node(s) 1918 for authorization/authentication and initiation of a data session, and to serving node(s) 1916 for communication thereafter. Server(s) 1914 can also effect security (e.g., implement one or more firewalls) of macro network platform 1910 to ensure network's operation and data integrity in addition to authorization and authentication procedures that CS gateway node(s) 1912 and PS gateway node(s) 1918 can enact. Moreover, server(s) 1914 can provision services from external network(s), e.g., WAN 1950, or Global Positioning System (GPS) network(s), which can be a part of enterprise NW(s) 1980. It is to be noted that server(s) 1914 can include one or more processor configured to confer at least in part the functionality of macro network platform 1910. To that end, the one or more processor can execute code instructions stored in memory 1930, for example.

In example wireless environment 1900, memory 1930 stores information related to operation of macro network platform 1910. Information can include business data associated with subscribers; market plans and strategies, e.g., promotional campaigns, business partnerships; operational data for mobile devices served through macro network platform; service and privacy policies; end-user service logs for law enforcement; and so forth. Memory 1930 can also store information from at least one of telephony network(s) 1940, WAN 1950, SS7 network 1960, enterprise NW(s) 1970, or service NW(s) 1980.

Regarding femto network platform 1980, it includes a femto gateway node(s) 1984, which have substantially the same functionality as PS gateway node(s) 1918, gateway node(s) 242. Additionally, femto gateway node(s) 1984 can also include substantially all functionality of serving node(s) 1916. Disparate gateway node(s) 1984 can control or operate disparate sets of deployed femto APs, which can be a part of femto RAN 1990. In an aspect of the subject innovation, femto gateway node(s) 1984 can operate in substantially the same manner as gateway node(s) 242. Analysis component 1920 can operate in substantially the same manner as component 246. In addition, analysis component 1920 can include substantially the same functionality as report component 248.

Memory 1986 can retain additional information relevant to operation of the various components of femto network platform 1980. For example operational information that can be stored in memory 1986 can comprise, but is not limited to, subscriber intelligence; contracted services; maintenance and service records; femtocell configuration (e.g., devices served through femto RAN 1990; authorized subscribers associated with one or more deployed femto APs); service policies and specifications; privacy policies; add-on features; so forth.

Server(s) 1982 have substantially the same functionality as described in connection with server(s) 1914. In addition, server(s) 1982 can have substantially the same, or the same, functionality as server(s) 250. In an aspect, server(s) 1982 can execute multiple application(s) that provide service (e.g., voice and data) to wireless devices served through femto RAN 1990. Server(s) 1982 can also provide security features to femto network platform. In addition, server(s) 1982 can manage (e.g., schedule, queue, format . . . ) substantially all packetized flows (e.g., IP-based, frame relay-based, ATM-based) it generates in addition to data received from macro network platform 1910. Furthermore, server(s) 1982 can effect provisioning of femtocell service, and effect operations and maintenance. It is to be noted that server(s) 1982 can include one or more processors configured to provide at least in part the functionality of femto network platform 1980. To that end, the one or more processors can execute code instructions stored in memory 1986, for example.

As it employed in the subject specification, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Processors can exploit nano-scale architectures such as, but not limited to, molecular and quantum-dot based transistors, switches and gates, in order to optimize space usage or enhance performance of user equipment. A processor may also be implemented as a combination of computing processing units.

In the subject specification, terms such as "store," "data store," "data storage," "database," "repository," and substantially any other information storage component relevant to operation and functionality of a component, refer to "memory components," or entities embodied in a "memory" or components comprising the memory. It will be appreciated that the memory components described herein can be either volatile memory or nonvolatile memory, or can include both volatile and nonvolatile memory.

By way of illustration, and not limitation, nonvolatile memory can include read only memory (ROM), programmable ROM (PROM), electrically programmable ROM (EPROM), electrically erasable ROM (EEPROM), or flash memory. Volatile memory can include random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). Additionally, the disclosed memory components of systems or methods herein are intended to comprise, without being limited to comprising, these and any other suitable types of memory.

Various aspects or features described herein may be implemented as a method, apparatus, or article of manufacture using standard programming and/or engineering techniques. In addition, various aspects disclosed in the subject specification can also be implemented through program modules stored in a memory and executed by a processor, or other combination of hardware and software, or hardware and firmware. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical disks (e.g., compact disc (CD), digital versatile disc (DVD), blu-ray disc (BD) . . . ), smart cards, and flash memory devices (e.g., card, stick, key drive . . . ).

It should be appreciated that while various aspects, features, or advantages described herein have been illustrated through femto access point(s) and associated femto coverage, such aspects and features also can be exploited for home access point(s) (HAPs) that provide wireless coverage through substantially any, or any, disparate telecommunication technologies, such as for example Wi-Fi (wireless fidelity) or picocell telecommunication. Additionally, aspects, features, or advantages of the subject innovation can be exploited in substantially any wireless telecommunication, or radio, technology; for example, Wi-Fi, Worldwide Interoperability for Microwave Access (WiMAX), Enhanced General Packet Radio Service (Enhanced GPRS), 3GPP LTE, 3GPP2 UMB, 3GPP UMTS, HSPA, HSDPA, HSUPA, or LTE Advanced. Moreover, substantially all aspects of the subject innovation can include legacy telecommunication technologies.

What has been described above includes examples of systems and methods that provide advantages of the subject innovation. It is, of course, not possible to describe every conceivable combination of components or methodologies for purposes of describing the subject innovation, but one of ordinary skill in the art may recognize that many further combinations and permutations of the claimed subject matter are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

What is claimed is:

1. A method, comprising:
receiving, by a femto access point comprising a processor, a directive to scan a wireless environment and a scan configuration associated with the directive;
scanning, by the femto access point, the wireless environment, wherein the scanning comprises scanning in accordance with the scan configuration, in response to the scan configuration being determined to be compatible with an operation of the femto access point and scanning the wireless environment in accordance with a modified scan configuration generated by modifying the scan configuration, in response to the scan configuration being determined to be incompatible with the operation of the femto access point; and
collecting, by the femto access point, macro-network operation data that comprises data related to a first measurement obtained from a first frequency band associated with a first network operated by a first service provider and a second measurement obtained from a second frequency band associated with a second network operated by a second service provider, based on the scanning.

2. The method of claim 1, further comprising:
retaining, by the femto access point, a scan log that is generated subsequent to the collecting and enables analysis of log data in the scan log.

3. The method of claim 1, conveying, by the femto access point, the macro-network operation data in accordance with the scan configuration.

4. The method of claim 3, wherein the conveying comprises conveying, by the femto access point, the macro-network operation based on a retention protocol that comprises a schedule to deliver the macro-network operation data.

5. The method of claim 1, wherein the collecting comprises decoding, by the femto access point, a measurement of a wireless signal on a radio technology, in accordance with the scan configuration.

6. The method of claim 5, wherein the decoding comprises decoding the measurement of the wireless signal that originates from a macro base station, to facilitate determining a downlink carrier frequency.

7. The method of claim 1, wherein the receiving comprises receiving, by the femto access point, a scan profile that specifies a set of measurements, including the first measurement and the second measurement, to be performed during a scan.

8. The method of claim 1, further comprising:
determining, by the femto access point, a time-of-flight measurement that facilitates an extraction of location-based information associated with a radio transmission resource of the second network.

9. The method of claim 1, wherein the scanning comprises scanning, by the femto access point, the wireless environment in response to a performance criterion related to service quality being met.

10. A system, comprising:
a memory to store instructions; and
a processor, coupled to the memory, that facilitates execution of the instructions to perform operations, comprising:
scanning a wireless environment of a femto access point, in accordance with a scan configuration received via a core mobile network,
collecting network operation data associated with a first network operated by a first service provider and a second network operated by a second service provider,
identifying a quality of strength of a wireless signal in the wireless environment, based on an analysis of the network operation data, and
determining a time-of-flight measurement that facilitates an extraction of location-based information associated with a radio transmission resource of the second network.

11. The system of claim 10, wherein the memory retains the network operation data.

12. The system of claim 10, wherein the operations further comprise:
decoding a measurement of the wireless signal on one of a set of frequency bands, wherein the measurement is specified in the scan configuration.

13. The system of claim 12, wherein the wireless signal originates from a macro base station device, and wherein the measurement facilitates a determination of a downlink channel quality.

14. The system of claim 12, wherein the operations further comprise:
utilizing a set of code sequence hypothesis to decode the measurement.

15. The system of claim 12, wherein the operations further comprise:
receiving the scan configuration including a scan profile that specifies the measurement to be performed during a scan.

16. The system of claim 10, wherein the operations further comprise:
determining a scan schedule.

17. The system of claim 10, wherein the operations further comprise:
modifying the scan configuration resulting in a modified scan configuration and scanning the wireless environment in accordance with the modified scan configuration, in response to the scan configuration being incompatible with an operation of the femto access point.

18. The system of claim 16, wherein the network operation data is delivered to the core mobile network in accordance with a delivery schedule specified in the scan configuration.

19. The system of claim 16, wherein the operations further comprise:
scheduling a received directive to scan the wireless environment to a time after which a scan performance satisfies an operation criterion associated with the femto access point.

20. The system of claim 10, wherein the operations further comprise:
administering the network operation data, and consolidating a set of databases of related data.

21. A method, comprising:
configuring, by a system comprising a processor, a scan protocol that affords to collect network operation data in a set of wireless environments from a set of femto access points;
delivering, by the system, a directive to scan the a set of wireless environments and a scan profile comprising the scan protocol, to the set of femto access points;
receiving, by the system, network operation data, comprising information associated with a first network operated by a first service provider and a second network operated by a second service provider, that is measured by the set of femto access points, in accordance with the scan profile;
analyzing, by the system, the network operation data to generate network operation intelligence; and
predicting, by the system, a capacity evolution based on the analyzing.

22. The method of claim 21, further comprising: conveying, by the system, the network operation data.

23. The method of claim 22, further comprising:
mapping, by the system, the network operation data to a set of locations; and
determining, by the system, a distance registry of locations of respective macro base stations, on the mapping.

24. The method of claim 21, further comprising: retaining, by the system, the network operation data and the network operation intelligence.

25. The method of claim 21, wherein the delivering comprises delivering, by the system, the scan profile, in response to receiving an acknowledgement of receipt of the directive.

26. The method of claim 21, wherein the configuring comprises:
generating, by the system, a schedule to scan one of the set of wireless environments; and
specifying, by the system, a scan profile that comprises a set of measurements to be conducted in a scan of the one of the set of wireless environments.

27. The method of claim 22, wherein the analyzing comprises:
compiling, by the system, the network operation data associated with wireless network operation in one of the set of wireless environments; and
mapping, by the system, the network operation data to a network operator, based on the compiling.

28. The method of claim 27, further comprising: extracting, by the system, a number of sector identifiers associated with the network operator, based on the compiling.

29. The method of claim 28, further comprising: assessing, by the system, a capacity density that comprises a number of unique sector carriers associated with the network operator normalized by a carrier's bandwidth, based on the compiling.

30. The method of claim 29, further comprising: determining, by the system, an inter-carrier interference for intra-operator sector carriers based on an analysis of the network operation data.

31. The method of claim 22, wherein the conveying comprises:
receiving, by the system, a request to deliver the network operation data; and
delivering, by the system, the network operation data, in response to the request being authorized.

32. The method of claim 21, further comprising:
receiving, by the system, a command to manipulate the network operation data; and
implementing, by the system, the command on the network operation data.

33. A system, comprising:
a memory to store instructions; and
a processor, coupled to the memory, that facilitates execution of the instructions to perform operations, comprising:
conveying to a femto access point, a directive to scan a wireless environment and a scan configuration associated with the directive,
receiving network operation data, comprising information associated with a first network operated by a first service provider and a second network operated by a second service provider, that is measured by the femto access point,
aggregating the network operation data,
determining network intelligence based on the network operation data, and associating the network operation data with a set of locations.

34. The system of claim 33, wherein the operations further comprise:
acquiring the network operation data.

35. The system of claim 34, wherein the operations further comprise: predicting macro network coverage development, based on the network operation data.

36. The system of claim 33, wherein the operations further comprise: facilitating a prediction of a capacity evolution based on an analysis of the network operation data.

37. The system of claim 33, wherein the operations further comprise: determining a distance registry of locations of respective macro base stations, based on the set of locations.

38. The system of claim 33, wherein the operations further comprise: extracting, from the network operation data, a first number of sector identifiers associated with the first network and a second number of sector identifiers associated with the second network.

39. The system of claim 38, wherein the operations further comprise: evaluating the network operation data to extract a traffic density that comprises uplink noise associated with a mobile device detected in a predetermined time interval.

40. The system of claim 38, wherein the operations further comprise: determining inter-carrier interference for intra-operator sector carriers based on an analysis of the network operation data.

41. The system of claim 34, wherein the operations further comprise: receiving a request to deliver the network operation data and conveying the network operation data, in response to reception of the request.

42. The system of claim 34, wherein the operations further comprise: conveying a request to access the network operation data.

43. The system of claim 34, wherein the operations further comprise: conveying a directive to manipulate the network operation data.

44. The system of claim 33, wherein the operations further comprise: facilitating a transmission of a scan profile that comprises a set of measurements to be conducted in connection with a scan of the wireless environment.

* * * * *